(12) United States Patent
Hirabayashi

(10) Patent No.: US 6,597,626 B2
(45) Date of Patent: Jul. 22, 2003

(54) SYNCHRONOUS SEMICONDUCTOR MEMORY DEVICE

(75) Inventor: Osamu Hirabayashi, Hiratsuka (JP)

(73) Assignee: Kabushiki Kaisha Toshiba, Kanagawa-ken (JP)

(*) Notice: Subject to any disclaimer, the term of this patent is extended or adjusted under 35 U.S.C. 154(b) by 0 days.

(21) Appl. No.: 09/729,979

(22) Filed: Dec. 6, 2000

(65) Prior Publication Data

US 2001/0012233 A1 Aug. 9, 2001

(30) Foreign Application Priority Data

Dec. 7, 1999 (JP) .......................................... 11-348055

(51) Int. Cl.[7] ................................................ G11C 8/00
(52) U.S. Cl. ........................ 365/233; 365/194; 365/207
(58) Field of Search ................................. 365/233, 239, 365/194, 205, 207, 208

(56) References Cited

U.S. PATENT DOCUMENTS

| | | | | |
|---|---|---|---|---|
| 5,901,110 A | * | 5/1999 | Jang ............................ | 365/233 |
| 5,953,285 A | * | 9/1999 | Churchill et al. ........... | 365/233 |
| 6,011,751 A | * | 2/2000 | Hirabayashi ................. | 365/233 |
| 6,078,547 A | * | 6/2000 | Leung ......................... | 365/233 |
| 6,144,230 A | * | 11/2000 | Kim ............................ | 365/205 |
| 6,154,393 A | * | 11/2000 | Otsuka et al. .............. | 365/233 |
| 6,154,394 A | * | 11/2000 | Hirabayashi ................. | 365/233 |
| 6,154,417 A | * | 11/2000 | Kim ............................ | 365/233 |

* cited by examiner

Primary Examiner—Trong Phan
(74) Attorney, Agent, or Firm—Banner & Witcoff, Ltd.

(57) ABSTRACT

An improved synchronous semiconductor memory device is described in which it is possible to reduce the noise level without compromising the reading speed. The synchronous semiconductor memory device is composed of a memory cell array including a plurality of memory cells for storing data items; a row selection circuit for receiving a row address signal decoded by a row decoder and selecting one row of the memory cell array; a column selection circuit for receiving a column address signal decoded by a column decoder and selecting a plurality of columns of the memory cell array at the same time; a plurality of sense amplifiers for amplifying a plurality of data items which are selected by the row selection circuit and the column selection circuit and are outputted to a plurality of data lines; and a selector element for sequentially outputting the data items which are amplified by the plurality of amplifiers in a time-interleaved manner. Particularly, the plurality of the amplifiers are activated one after another.

57 Claims, 14 Drawing Sheets

PRIOR ART (A) CLOCK (B) ADDRESS SIGNAL (C) SENSE ENABLING SIGNAL (D) SENSE AMPLIFIER 1

(E) SENSE AMPLIFIER 2

(F) OUTPUT DATA

SYNCHRONOUS SEMICONDUCTOR MEMORY DEVICE

CROSS REFERENCE TO RELATED APPLICATIONS

The subject application is related to subject matter disclosed in the Japanese Patent Application No. Hei 11-348055 filed in Dec. 7, 1999, in Japan, to which the subject application claims priority under the Paris Convention and the entire contents of which is incorporated by reference herein.

Also, the entire contents of U.S. patent application Ser. No. 09/268,688 filed on Dec. 7, 1999, in United States of America as assigned to the assignee of the subject application and the entire contents of U.S. patent application Ser. No. 09/299,857 filed on Apr. 26, 1999, in United States of America as assigned to the assignee of the subject application are incorporated by reference herein.

BACKGROUND OF THE INVENTION

1. Field of the Invention

The present invention relates to a synchronous semiconductor memory device, more particular to a Double Data Rate (DDR) synchronous semiconductor memory device, and more generally to a multiple data rate transmission semiconductor memory device.

2. Prior Art

In recent years, it is an important issue in the quest for faster semiconductor systems to increase the data transmission rate between a CPU and a semiconductor memory device. One high speed data transmission design is a design that supports the double data rate mode.

FIG. 1 is a block diagram showing a semiconductor memory device in accordance with a conventional technique supporting the double data rate mode. FIG. 3 is a schematic diagram showing waveforms of the respective signals appearing when data is read from the semiconductor memory device. When an address signal, as illustrated in FIG. 3(B), is input to an address decoder 12 through an address register 11, the address decoder 12 serves to decode the address signal and output a decoded address signal for selecting a row to a row selection circuit 13, and a decoded address signal for selecting a column to a column selection circuit 14. The row selection circuit 13 and the column selection circuit 14 serve to select two memory cells for one I/O terminal in accordance with the address signals as decoded. Two data items are read out from the two memory cells substantially at the same time and input to data input/output circuits 16 and 17 through the data bus (1) and the data bus (2).

A multiplexer 18 serves to select and output one of the data items as outputted from the data input/output circuits 16 and 17 in synchronism with the high and low levels of the clock signal as illustrated in FIG. 3(A).

Namely, in accordance with the double data rate mode, the data bus structure is designed, unlike a conventional semiconductor memory device, in a dual structure consisting of two equivalent buses inside of a semiconductor memory device in order to read out and write at the doubled speed. Furthermore, the data transmission rate is doubled by alternately reading out of or writing in to the semiconductor memory device through a data input/output unit in synchronism with the high and low levels of the clock signal.

FIG. 2 is a block diagram showing the output control unit of the semiconductor memory device supporting the double data rate mode. The signals on the data buses (1) and (2) of the dual structure are amplified substantially at the same time by means of a sense amplifier 161, for the signal on data bus (1), and a sense amplifier 163, for the signal on data bus (2), in synchronism with a sense amplifier enabling signal/ SAE, as illustrated in FIG. 3(C), in order to transfer the amplified signals to the output register 162, for the signal on data bus (1), and the output register 164, for the signal on data bus (2). The data items latched by the output register 162 and the output register 164 are input to the multiplexer 18 which is controlled by the clock signal, as illustrated in FIG. 3(A), and alternately output to the I/O terminal in synchronism with the high and low levels of the clock signal.

In accordance with the conventional semiconductor memory device supporting the double data rate mode as described above, the number of the sense amplifiers activated by the sense amplifier enabling signal /SAE is doubled as compared with that of a semiconductor memory device operating in the normal mode. For example, in the case of 36 I/O terminals, 72 sense amplifiers are activated at the same time. Since a sense amplifier consumes considerable current for the purpose of amplifying a very small differential voltage, a number of the sense amplifiers tend to function as a problematic noise source when they are activated at the same time as described above. This kind of power source noise may cause of malfunction and tends to degrade the sensitivity of the sense amplifier itself, resulting in deterioration in the characteristics thereof. Namely, in accordance with the conventional semiconductor memory device supporting the double data rate mode, there is a problem that substantial noise is generated by simultaneously activating double the number of the sense amplifier as compared with that with the number of sense amplifiers activated during a conventional memory operation.

SUMMARY OF THE INVENTION

The present invention has been developed in order to solve the shortcomings as described heretofore. It is an object of the present invention to provide an improved semiconductor memory device having an output control unit, which makes possible a reduction in the noise level without compromising the reading speed.

In brief, the above and other objects and advantages of the present invention are provided by a new and improved synchronous semiconductor memory device comprising: a memory cell array consisting of a plurality of memory cells for storing data items; a row selection circuit for receiving a row address signal decoded by a row decoder and selecting one row of the memory cell array; a column selection circuit for receiving a column address signal decoded by a column decoder and selecting first and second columns of the memory cell array at the same time; first and second sense amplifiers for amplifying first and second data items which are selected by the row selection circuit and the column selection circuit and outputted to first and second data lines; and a selector element for sequentially outputting the first and second data items which are amplified by the first and second sense amplifiers in accordance with a time-interleaved manner, wherein the second sense amplifier is activated after the first sense amplifier is activated.

In a preferred embodiment, further improvement is provided by the semiconductor memory device further comprising a first data storage element for latching a first data item amplified by the first sense amplifier and a second data storage element for latching a second data item amplified by the second sense amplifier.

Also, in a preferred embodiment, the second sense amplifier is activated by an activation signal which is generated through a first delay circuit by imposing a delay time on the activation signal for activating the first sense amplifier.

In accordance with this configuration, it is possible to disperse the electric current peak time points and reduce the noise level without compromising the reading speed by deferring activation of the sense amplifier, which is one of the two sense amplifiers for sensing and amplifying data to be outputted, when the clock signal is pulled down while the other sense amplifier serves to sense and amplify data to be outputted when the clock signal is pulled up. Also, in the sense amplifier serving to sense and amplify data to be outputted when the clock signal is pulled up, the interval between the time point at which the address becomes ready and the time point at which the sense amplifier enabling signal is given is elongated, as compared with the case where the sense amplifier serves to sense and amplify data to be outputted when the clock signal is pulled up, resulting in a relatively large margin for sensing and therefore resulting in a noise proof structure.

Furthermore, in a preferred embodiment, the delay time $\Delta t1$ imposed by the first delay circuit is selected to satisfy $0 \leq \Delta t1 \leq Tcy/2$ where $Tcy$ is a cycle time of said semiconductor memory device.

Furthermore, in a preferred embodiment, the size of the transistors of the second sense amplifier is designed to be smaller than that of the transistors of the first sense amplifier. By this configuration, it is possible to reduce the power consumption and the area of the semiconductor chip as occupied.

In accordance with the configuration, it is possible to make the semiconductor memory device faster and to reduces the power dissipation by deferring activation of the sense amplifier provided for sensing and amplifying data to be outputted when the clock signal is pulled down with a delay time of about a half of the cycle time.

Furthermore, in a preferred embodiment, the semiconductor memory device further comprises a second delay circuit for deferring the operation of the second data storage element in order to latch the second data item after the first data storage element latches the first data item.

Furthermore, in a preferred embodiment, the delay time $\Delta t2$ imposed by the second delay circuit is selected to satisfy $0 \leq \Delta t1 \leq \Delta t2 \leq Tcy/2$ where $\Delta t1$ is the delay time imposed by the first delay circuit and $Tcy$ is a cycle time of the semiconductor memory device.

In accordance with the configuration, it is possible to make the semiconductor memory device faster and to reduce the power dissipation by deferring activation of the sense amplifier provided for sensing and amplifying data with a delay time of about a half of the cycle time.

Furthermore, in a preferred embodiment, the first data storage element is composed of a latch circuit which serves to latch for a preceding half period of the cycle time a data item which is obtained after a first control clock signal is pulled up. The second data storage element is composed of a latch circuit, which serves to latch through the cycle time a data item, which is obtained after a second control clock signal is pulled up.

Furthermore, in a preferred embodiment, the first data storage element is composed of a latch circuit which serves to latch for a preceding half period of cycle time a data item which is obtained after a control clock signal is pulled up. The second data storage element is composed of a latch circuit which serves to latch for a subsequent half period of the cycle time a data item which is obtained after the control clock signal is pulled down.

Furthermore, in a preferred embodiment, the delay time of the first delay circuit is about a half of the cycle time.

In accordance with the configuration, the sense amplifiers are designed to be capable of maintaining data for a time period of no shorter than one half of the machine cycle while deferring activation of the sense amplifier provided for sensing and amplifying data to be outputted when the clock signal is pulled down by one half of the machine cycle. As a result, it is possible to reduce the area of the semiconductor chip and to make the semiconductor memory device faster and to reduce the power dissipation.

Furthermore, in a preferred embodiment, the selector element serves to selectively output the first and second data items in synchronism with the rising edge and the falling edge of the system clock.

In accordance with another aspect of the present invention, a synchronous semiconductor memory device comprising: a memory cell array including a plurality of memory cells for storing data items; first and second sense amplifiers connected in parallel to one output terminal for amplifying the data items stored in the plurality of memory cells; a selector element for selectively outputting the data items as outputted from the first and second sense amplifiers; and a first delay circuit for displacing the time points at which the first and second sense amplifiers are activated from one another, the first and second sense amplifiers are controlled to be capable of maintaining output data for a time period no shorter than a half of the cycle time.

In accordance with a further aspect of the present invention, a synchronous semiconductor memory device comprising: a memory cell array including a plurality of memory cells for storing data items; a row selection circuit for receiving a row address signal decoded by a row decoder and selecting one row of the memory cell array; a column selection circuit for receiving a column address signal decoded by a column decoder and selecting a plurality of columns of the memory cell array at the same time; a plurality of sense amplifiers for amplifying a plurality of data items which are selected by the row selection circuit and the column selection circuit and outputted to a plurality of data lines; and a selector element for sequentially outputting the data items one after another which are amplified by means of the plurality of the amplifiers in a time-interleaved manner, wherein the plurality of the amplifiers are activated one after another.

In accordance with this configuration, it is also possible to disperse the electric current peak time points and reduce the noise level without compromising the reading speed by deferring activation of the sense amplifier which is one of the two sense amplifiers for sensing and amplifying data to be outputted when the clock signal is pulled down while the other sense amplifier serves to sense and amplify data to be outputted when the clock signal is pulled up. Also, in the sense amplifier serving to sense and amplify data to be outputted when the clock signal is pulled up, the interval between the time point at which the address becomes ready and the time point at which the sense amplifier enabling signal is given is elongated, as compared with the case where the sense amplifier serves to sense and amplify data to be outputted when the clock signal is pulled up, resulting in a relatively large margin for sensing and therefore resulting in a noise proof structure.

BRIEF DESCRIPTION OF DRAWINGS

The aforementioned and other features and objects of the present invention and the manner of attaining them will become more apparent and the invention itself will be best understood by reference to the following description of preferred embodiments taken in conjunction with the accompanying drawings, wherein.

DETAILED DESCRIPTION OF EMBODIMENTS

Several preferred embodiments of the invention will now be described in conjunction with the accompanied drawings.

Figure 1:
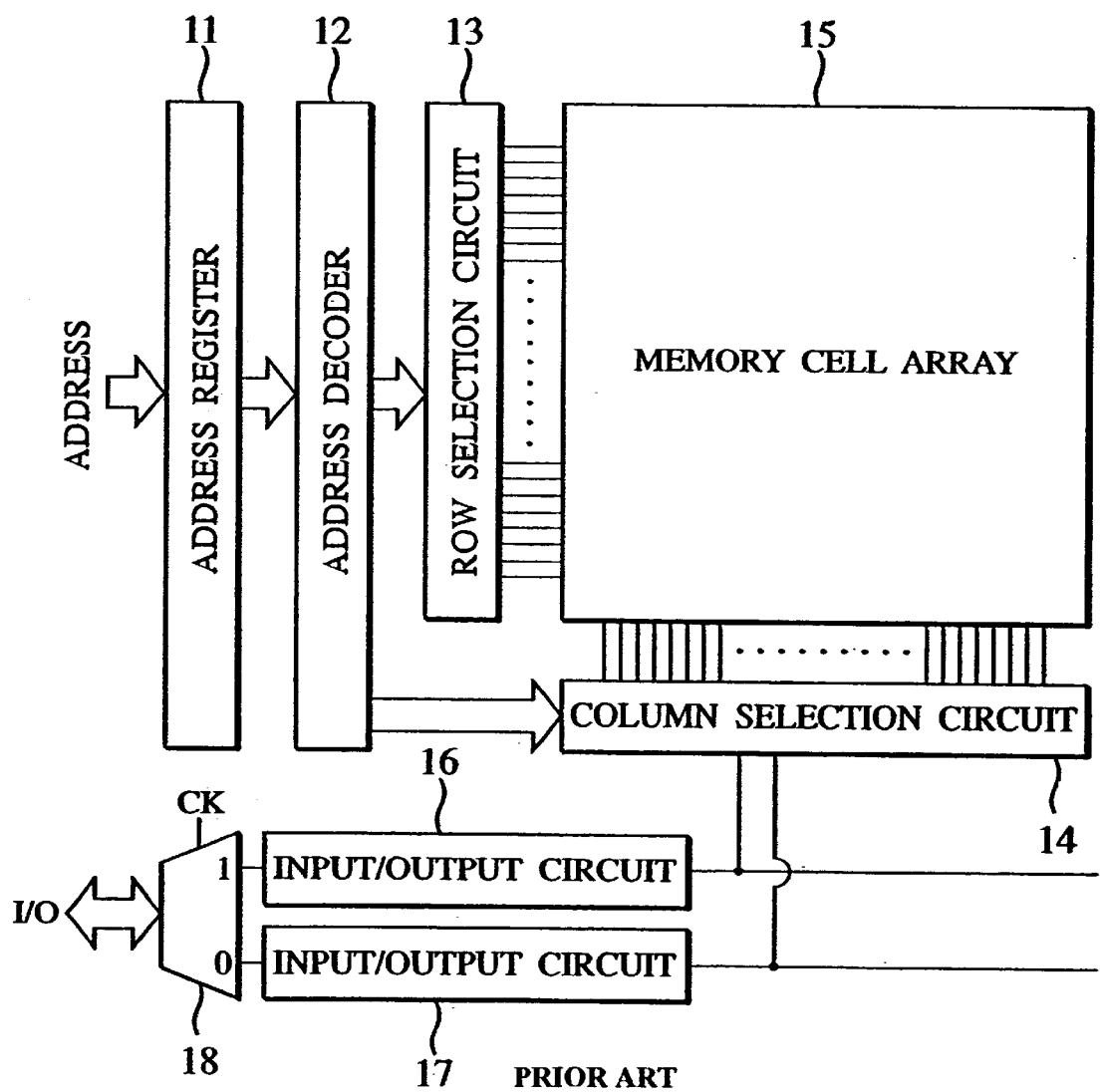
FIG. 1 is a block diagram showing a semiconductor memory device in accordance with a conventional technique supporting the double data rate mode.
Figures 2, 3:
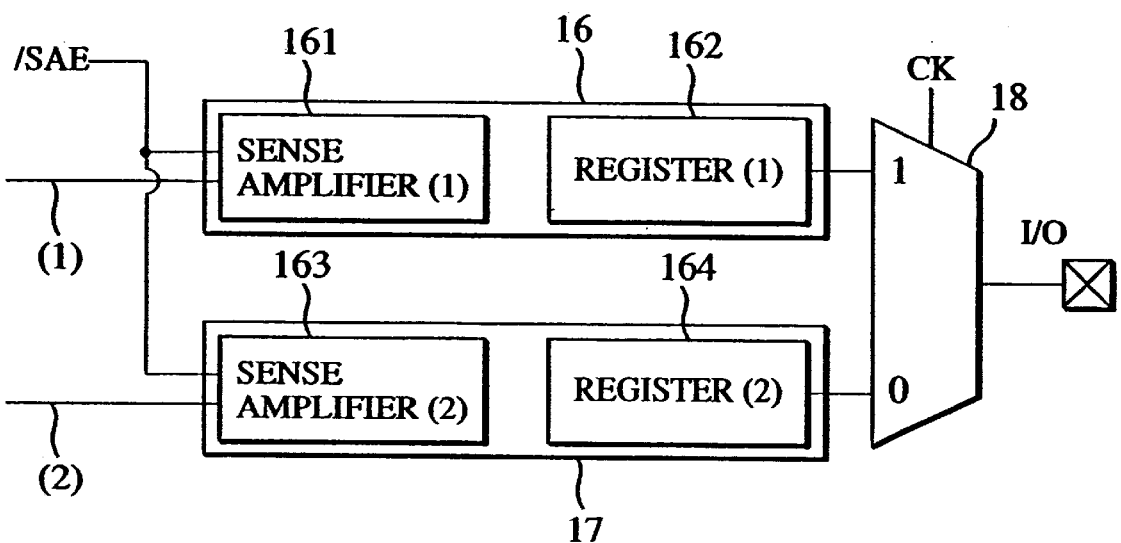
FIG. 2 is a block diagram showing the output control unit of the prior art semiconductor memory device supporting the double data rate mode.
FIG. 3 is a schematic diagram showing waveforms of the respective signals appearing when data is read from the conventional semiconductor memory device.
Figure 4:
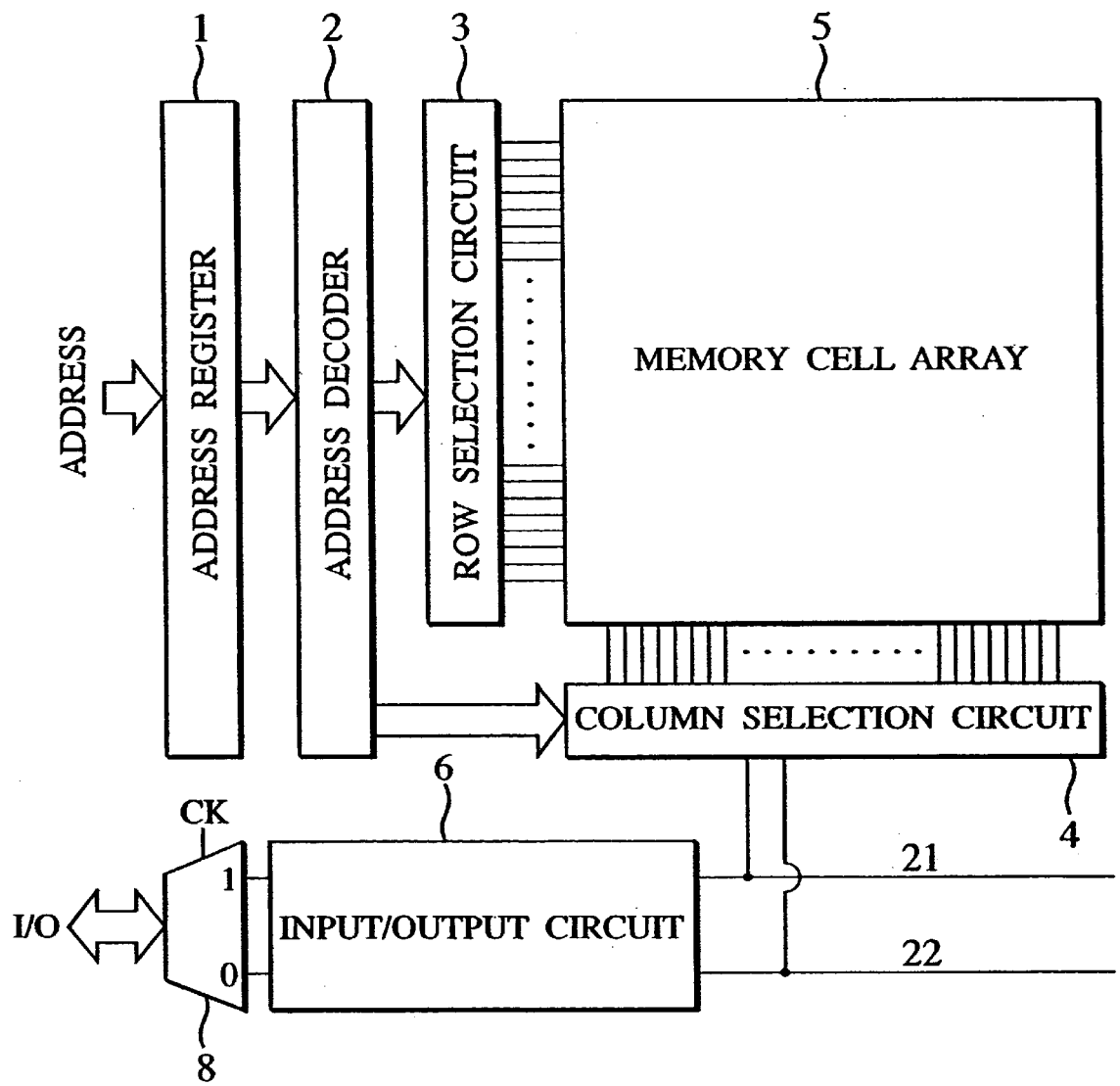
FIG. 4 is a block diagram showing a semiconductor memory device supporting the double data rate mode in accordance with a first embodiment of the present invention.

FIG. 4 is a block diagram showing a semiconductor memory device supporting the double data rate mode in accordance with a first embodiment of the present invention.

The semiconductor memory device is composed of a memory cell array 5 having a number of memory cells, an address register 1, an address decoder 2 for receiving and decoding an address as latched by the address register 1, a row selection circuit 3 receiving from the address decoder 2 a row address signal for selecting a row of the memory cell array 5, a column selection circuit 4 receiving from the address decoder 2 a column address signal for selecting a column of the memory cell array 5, a data bus 21, a data bus 22, an output control unit 6 and a multiplexer 8. The row selection circuit 3 and the column selection circuit 4 serve to select two memory cells for one I/O terminal in accordance with the address signals as decoded.

The row selection circuit 3 serves to select one row of the memory cell array 5 in accordance with the row address signal decoded by means of the address decoder 2. On the other hand, the column selection circuit 4 serves to select two columns of the memory cell array 5 at the same time in accordance with the column address signal decoded by means of the address decoder 2. Two data items are read out from the two memory cells substantially at the same time and input to data input/output circuit 6 through the data bus 21 and the data bus 22. A multiplexer 18 serves to select and output one of the data items as outputted from the data input/output circuits 16 and 17 in synchronism with the high and low levels of the clock signal as illustrated in FIG. 7(A).

In accordance with the double data rate mode, the data bus structure is designed, unlike a conventional semiconductor memory device, in a dual structure consisting of two equivalent buses inside of a semiconductor memory device in order to read out and write at the doubled speed. Furthermore, the data transmission rate is doubled by alternately reading out or writing in the semiconductor memory device through the output control unit 6 and the multiplexer 8 in synchronism with the high and low levels of the clock signal.

Figure 5:
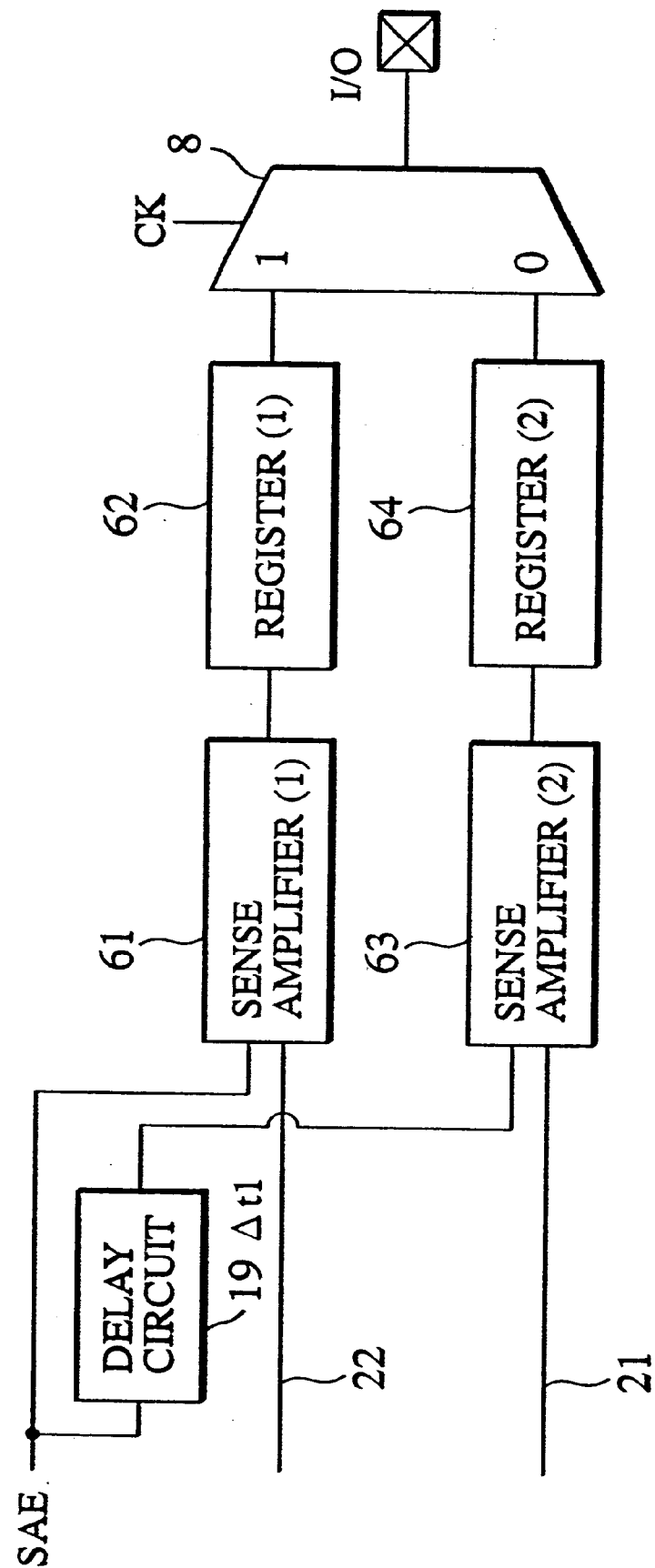
FIG. 5 is a block diagram showing the output control unit of the semiconductor memory device supporting the double data rate mode in accordance with the first embodiment of the present invention.

FIG. 5 is a block diagram showing the output control unit of the semiconductor memory device supporting the double data rate mode in accordance with the first embodiment of the present invention. The output control unit in accordance with this embodiment of the present invention is composed of two data transmission paths respectively through a sense amplifier 61 and an output register 62 and through a sense amplifier 63 and an output register 64, the multiplexer 8 for sequentially selecting and outputting one of the data items as latched by the output register 62 and the output register 64, and a delay circuit 19 for delaying a sense amplifier enabling signal which functions to activate the sense amplifier 63. The data items read out from the memory cells (not shown in the figure) are transferred to the sense amplifier 61 and the sense amplifier 63 through the data bus 21 and the data bus 22, respectively.

The sense amplifier 61 is activated by directly receiving the sense amplifier enabling signal /SAE and serves to sense and amplify a data item outputted when the clock signal is pulled up while the sense amplifier 63 is activated by receiving the sense amplifier enabling signal /SAE as delayed through the delay circuit 19 and serves to sense and amplify a data item outputted when the clock signal is pulled down.

Figure 6:
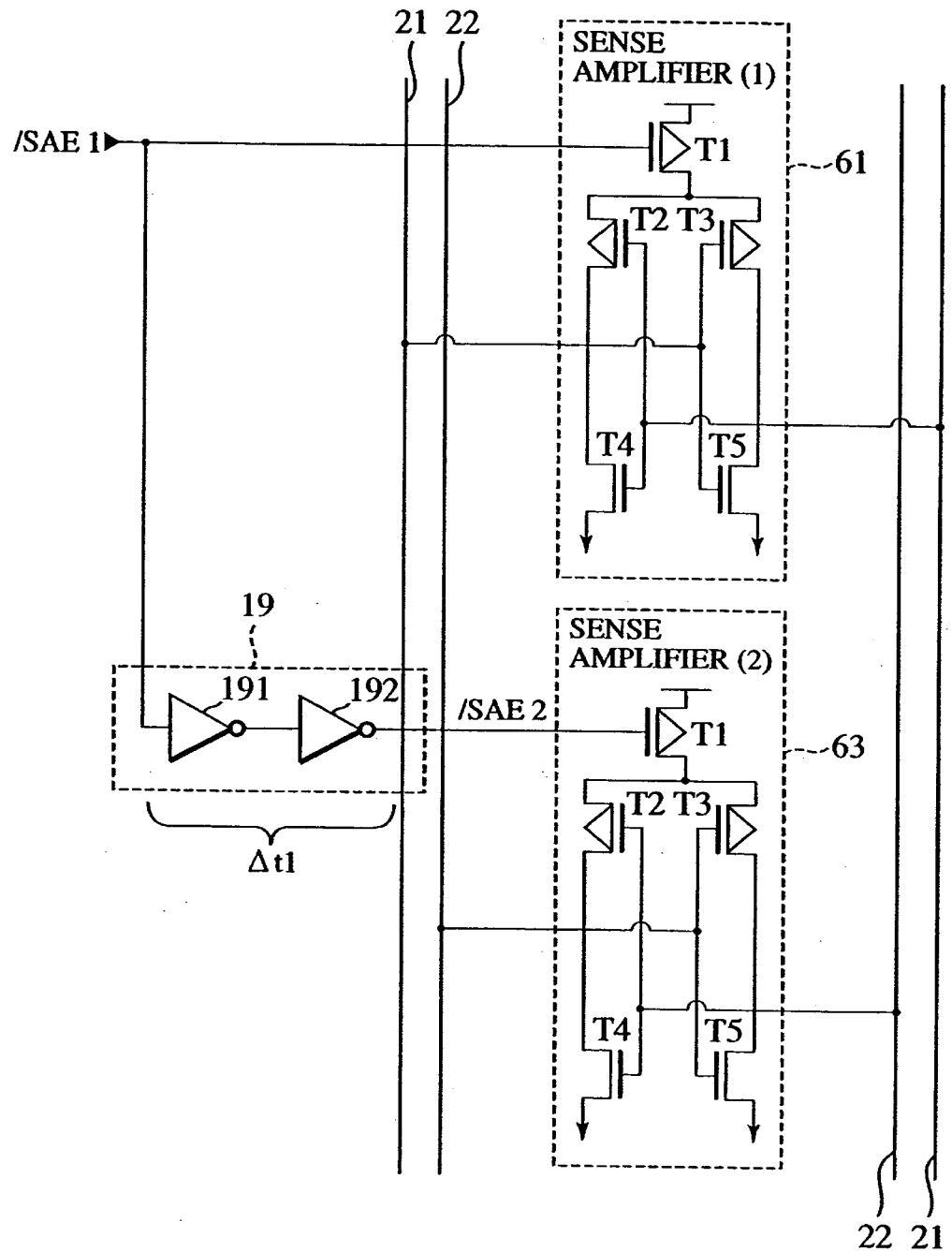
FIG. 6 is a circuit diagram showing the configuration inclusive of exemplary circuits of the sense amplifiers and the delay circuit as illustrated in FIG. 5.

FIG. 6 is a circuit diagram showing the configuration inclusive of exemplary circuits of the sense amplifiers and the delay circuit as illustrated in FIG. 5. In the figure, each sense amplifier is composed of a latch type sense amplifier while the delay circuit is composed of an inverter chain.

Namely, each sense amplifier is composed of PMOS transistors T1, T2 and T3 and NMOS transistors T4 and T5. The gate terminals of the PMOS transistor T2 and the NMOS transistor T4 are connected to the data bus 22 while the gate terminals of the PMOS transistor T3 and the NMOS transistor T5 are connected to the data bus 21. The delay circuit is composed of the inverter chain having inverters 191 and 192, which are connected in series.

Figure 7:
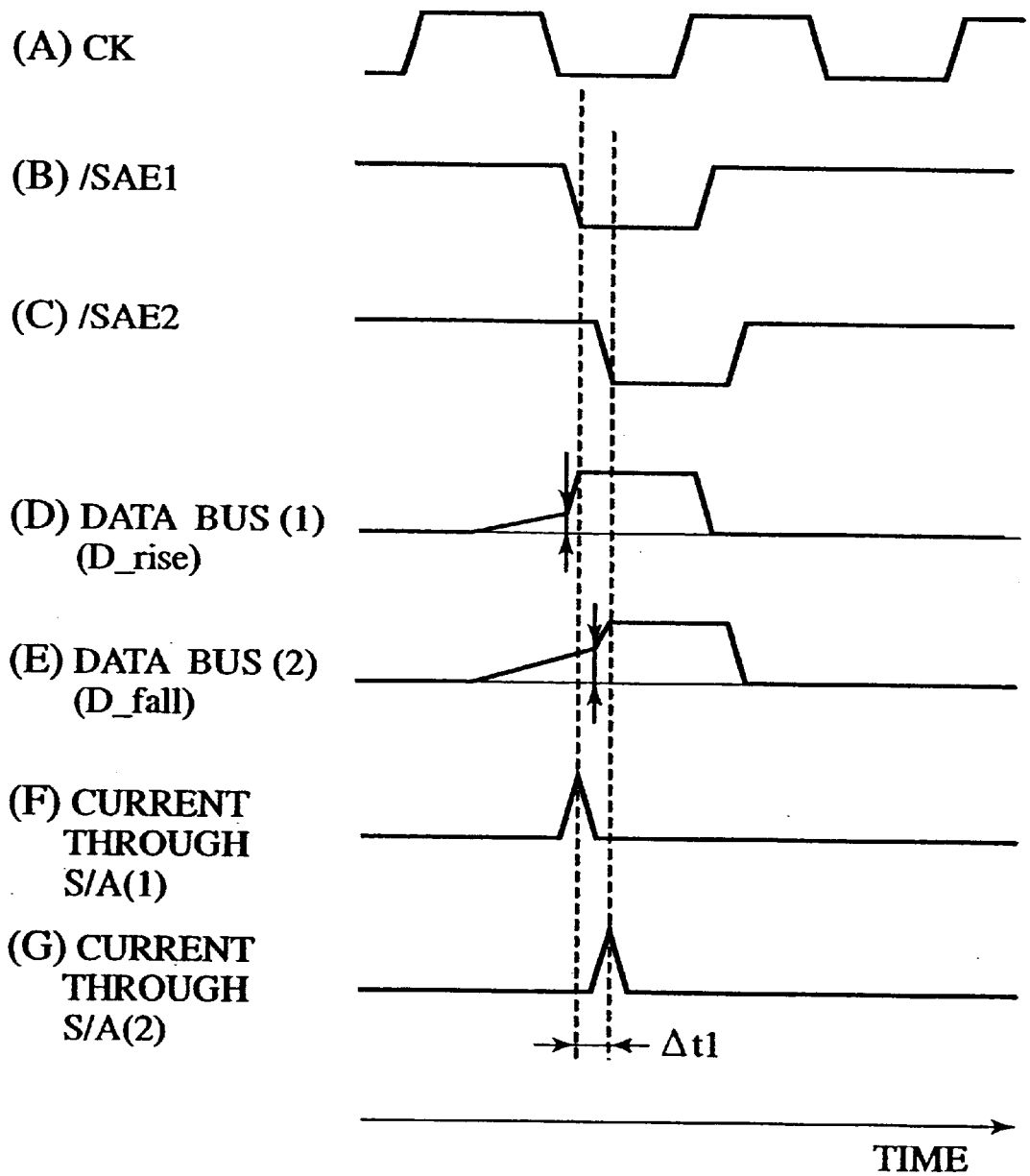
FIG. 7 is a schematic diagram showing waveforms of the respective signals appearing when data is read from the semiconductor memory device provided with the output control unit as illustrated in FIG. 6.

FIG. 7 is a schematic diagram showing waveforms of the respective signals appearing when data is read from the semiconductor memory device provided with the output control unit as illustrated in FIG. 6. FIG. 7(A) shows the waveform of the clock signal (CK) for use in the output circuit; FIG. 7(B) shows the waveform of the sense amplifier enabling signal /SAE1; FIG. 7(C) shows the waveform of the sense amplifier enabling signal /SAE2; FIG. 7(D) shows the waveform of the output signal of the sense amplifier 61; FIG. 7(E) shows the waveform of the output signal of the sense amplifier 63; FIG. 7(F) shows the waveform of the current flowing through the sense amplifier 61; and FIG. 7(G) shows the waveform of the current flowing through the sense amplifier 62.

The latch type sense amplifier generates a through current when activated by means of the sense amplifier enabling signal /SAE. The output control unit as described above serves to activate the sense amplifier 61 by means of the sense amplifier enabling signal /SAE1 and then, after the delay ($\Delta t1$) implemented by means of the inverter chain of the delay circuit 19, serves to activate the sense amplifier 63 by means of the sense amplifier enabling signal /SAE2. Accordingly, the time of the current peak of the sense amplifier 61 does not coincide with the time of the current peak of the sense amplifier 63 so that it is possible to disperse the current peak time points during operation.

The output signal of the sense amplifier 63 is therefore delayed as compared with that of the sense amplifier 61. However, this never imposes a bottleneck limiting the operation speed of the memory because there is no problem as long as the data item of the sense amplifier 63 becomes ready only during the later half of the subsequent cycle of the clock signal, i.e., when the clock signal is pulled down. It is required that the delay time $\Delta t1$ satisfies $0 \leq \Delta t1 \leq Tcy/2$ to delay the data item of the sense amplifier 63 until the later half of the subsequent cycle.

Also, the interval between the time point at which the address becomes ready and the time point at which the sense amplifier enabling signal is given is elongated in the case of the sense amplifier 63, as compared with the case of the sense amplifier 61, so that the differential input level to the sense amplifier 63 is relatively increased when activated, resulting in a relatively large margin for sensing and therefore resulting in a noise proof structure.

Figure 10:
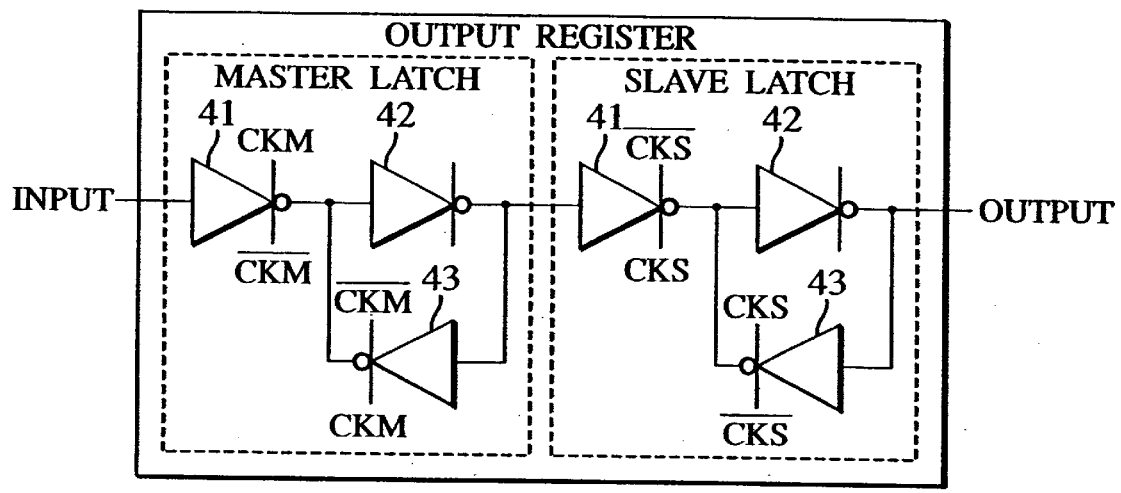
FIG. 10 is a circuit diagram showing the configuration inclusive of an exemplary circuit of the output registers in accordance with the second embodiment of the present invention.

FIG. 10 is a circuit diagram showing the configuration, inclusive of an exemplary circuit, of the output registers 62 and 64 in accordance with the second embodiment of the present invention. The output register is composed of a master latch and a slave latch. Each latch is composed of clocked inverters 41 and 42 and an inverter 43.

In accordance with the present embodiment, when two data items are read out from the memory cells in the double data rate mode, the current peak time points of the sense amplifier 61 and the sense amplifier 63 can be displaced from each other as illustrated in FIG. 7(F) and FIG. 7(G) by displacing the timing of activation of the sense amplifier 63 from that of the sense amplifier 61. In this case, since the displacement is adjusted to satisfy the relationship of $0 \leq \Delta t1 \leq Tcy/2$, the noise level can be reduced without compromising the reading speed.

Meanwhile, as illustrated in FIG. 7(D) and FIG. 7(E), the input level to the sense amplifier 63 when the sensing/amplifying operation thereof is initiated is higher than that to the sense amplifier 61 so that it is possible to reduce the area of the semiconductor chip as occupied by selecting the size of the transistors of the sense amplifier 63 to be smaller than that of the transistors of the sense amplifier 61.

Figure 8:
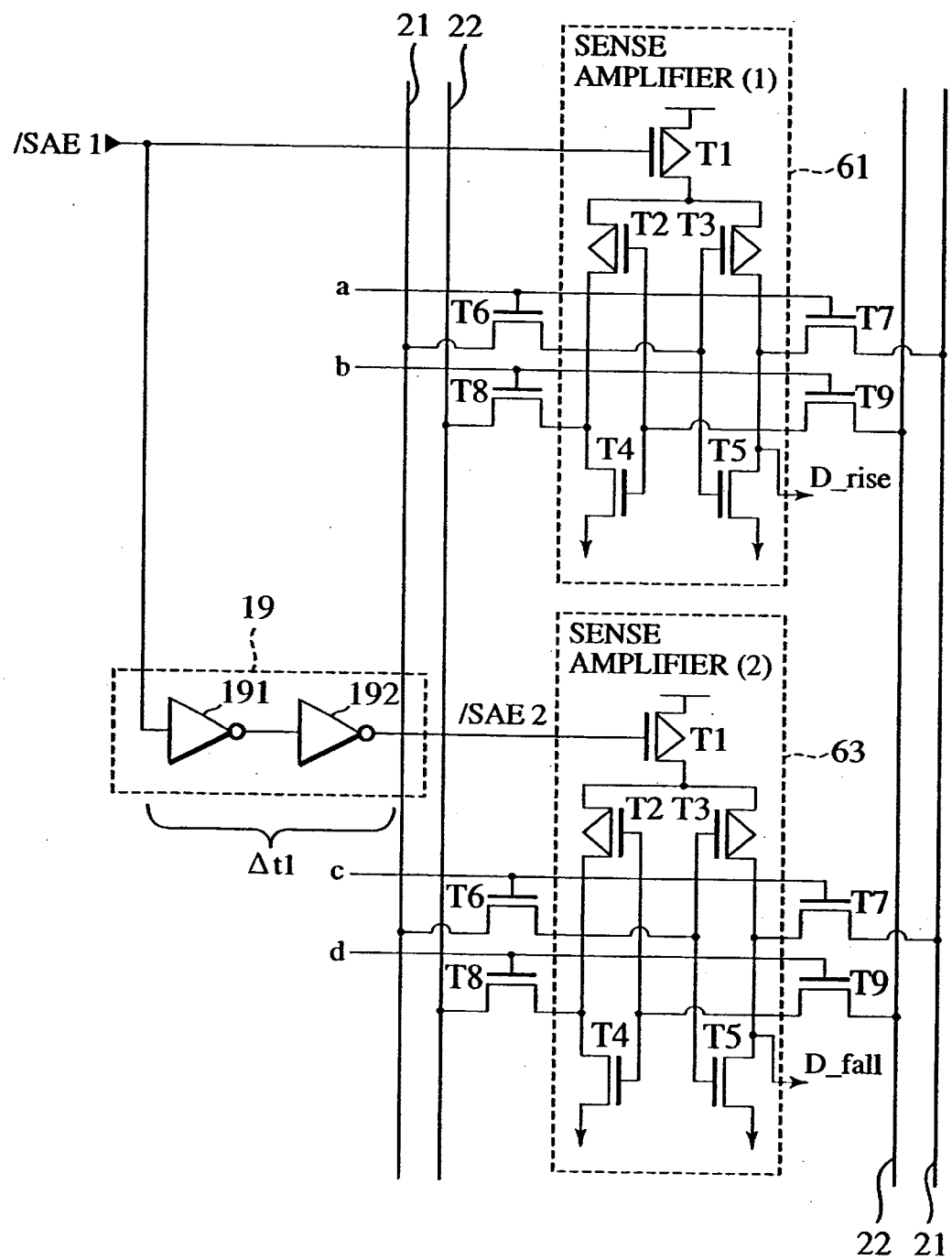
FIG. 8 is a block diagram showing the output control unit of the semiconductor memory device supporting the double data rate mode in accordance with a second embodiment of the present invention.

FIG. 8 is a block diagram showing the output control unit of the semiconductor memory device supporting the double data rate mode in accordance with a second embodiment of the present invention. Also in FIG. 8, like reference numbers indicate identical or functionally similar elements in the drawing as the output control unit as illustrated in FIG. 6 and, therefore redundant explanation is not repeated.

For the output control unit as illustrated in FIG. 6, the delay circuit 19 is always connected to the data bus 22 and is not connected to the data bus 21. In this case, however, some inconvenience may occur when data stored in an odd address is accessed while the data bus 21 is connected to the memory cells assigned to even addresses and the data bus 22 is connected to the memory cells assigned to odd addresses as given. Namely, when an odd address is given, some technical handling may be required, for example, insertion of a pause and neglect the leading data item of the even address which is input after decrementing the odd address.

In the case of the semiconductor memory device in accordance with the second embodiment of the present invention, a switch circuit is inserted to the output control unit thereof for switching even/odd addresses as illustrated in FIG. 8. As illustrated in the figure, the sense amplifier 61 is connected to the data bus 21 through an NMOS transistor T6 and an NMOS transistor T7 which constitute a transfer gate. Also, the sense amplifier 61 is connected to the data bus 22 through an NMOS transistor T8 and an NMOS transistor T9 which constitute a transfer gate.

On the other hand, the sense amplifier 63 is connected to the data bus 21 through the NMOS transistor T6 and the NMOS transistor T7 which constitute a transfer gate. Also, the sense amplifier 63 is connected to the data bus 22 through the NMOS transistor T8 and the NMOS transistor T9 which constitute a transfer gate.

The data item with an odd address can be read out by fixing the data lines b and c to the low level and the data lines a and d to the high level and connecting the upper sense amplifier 61 to the data bus 21 and the lower sense amplifier 63 to the data bus 22, respectively. Accordingly, in this case, the effective configuration of the circuit is equivalent to the circuit as illustrated in FIG. 5.

Figure 9:
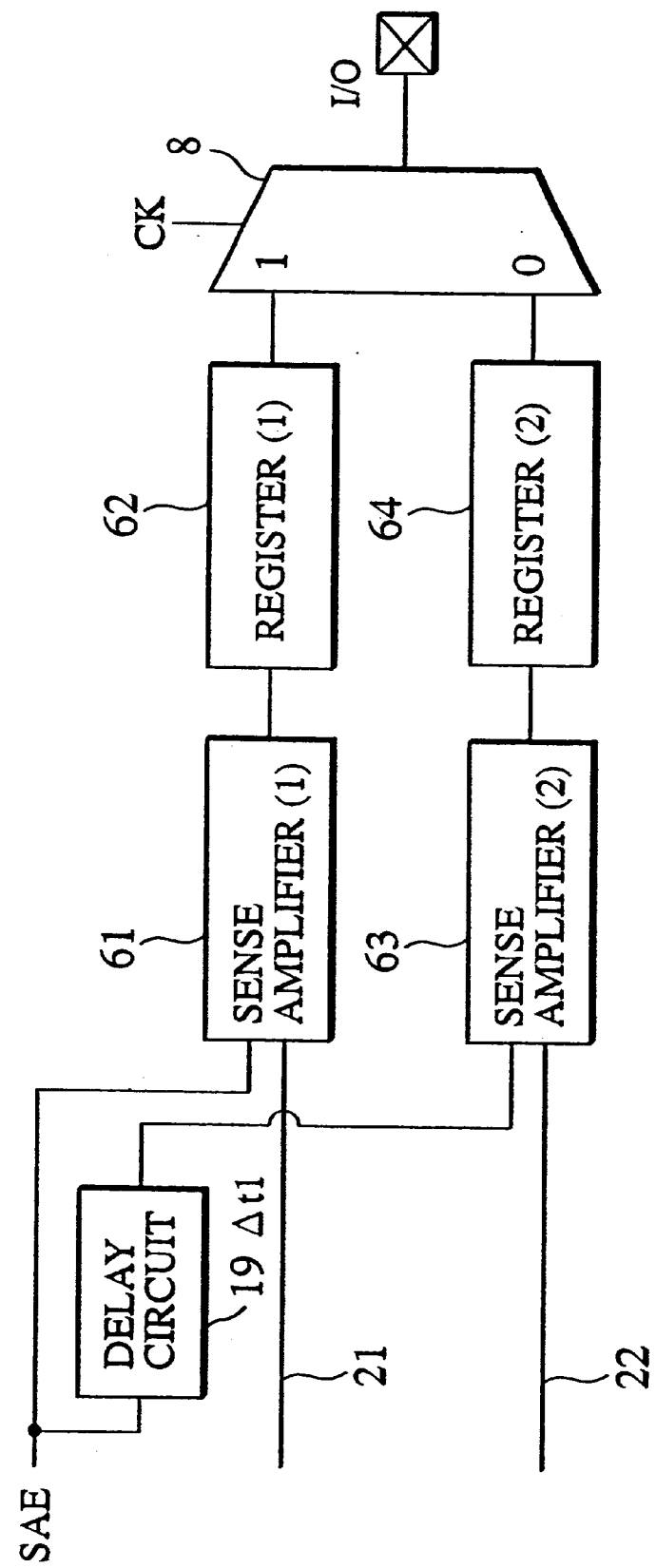
FIG. 9 is a block diagram showing the output control unit of the semiconductor memory device supporting the double data rate mode in accordance with the second embodiment of the present invention.

Also, the data item with an even address can be read out by fixing the data lines a and d to the low level and the data lines b and c to the high level and connecting the upper sense amplifier 61 to the data bus 22 and the lower sense amplifier 63 to the data bus 21 respectively. Accordingly, in this case, the effective configuration of the circuit is equivalent to the circuit as illustrated in FIG. 9. In the figure, the connection relationship of the sense amplifier 61, the sense amplifier 63, the data bus 21 and the data bus 22 is opposite to that as illustrated in FIG. 5.

FIG. 7 is a schematic diagram showing waveforms of the respective signals appearing when data is read from the semiconductor memory device with the signal D__rise as the output signal of the sense amplifier 61 and the signal D__fall as the output signal of the sense amplifier 63.

The configuration as illustrated in FIG. 8 is particularly effective when the semiconductor memory device in accordance with the present invention is actually implemented. Namely, it is realized by providing the switch circuit so that one of the sense amplifiers, i.e., the sense amplifier 61 always serves to sense and amplify the data item to be output when the clock signal is pulled up while the other sense amplifier, i.e., the sense amplifier 63 always serves to sense and amplify the data item to be output when the clock signal is pulled down. Accordingly, the delay circuit can be fixedly connected to the other sense amplifier, i.e., the sense amplifier 63 senses and amplifies the data item to be output when the clock signal is pulled down.

Figure 11:
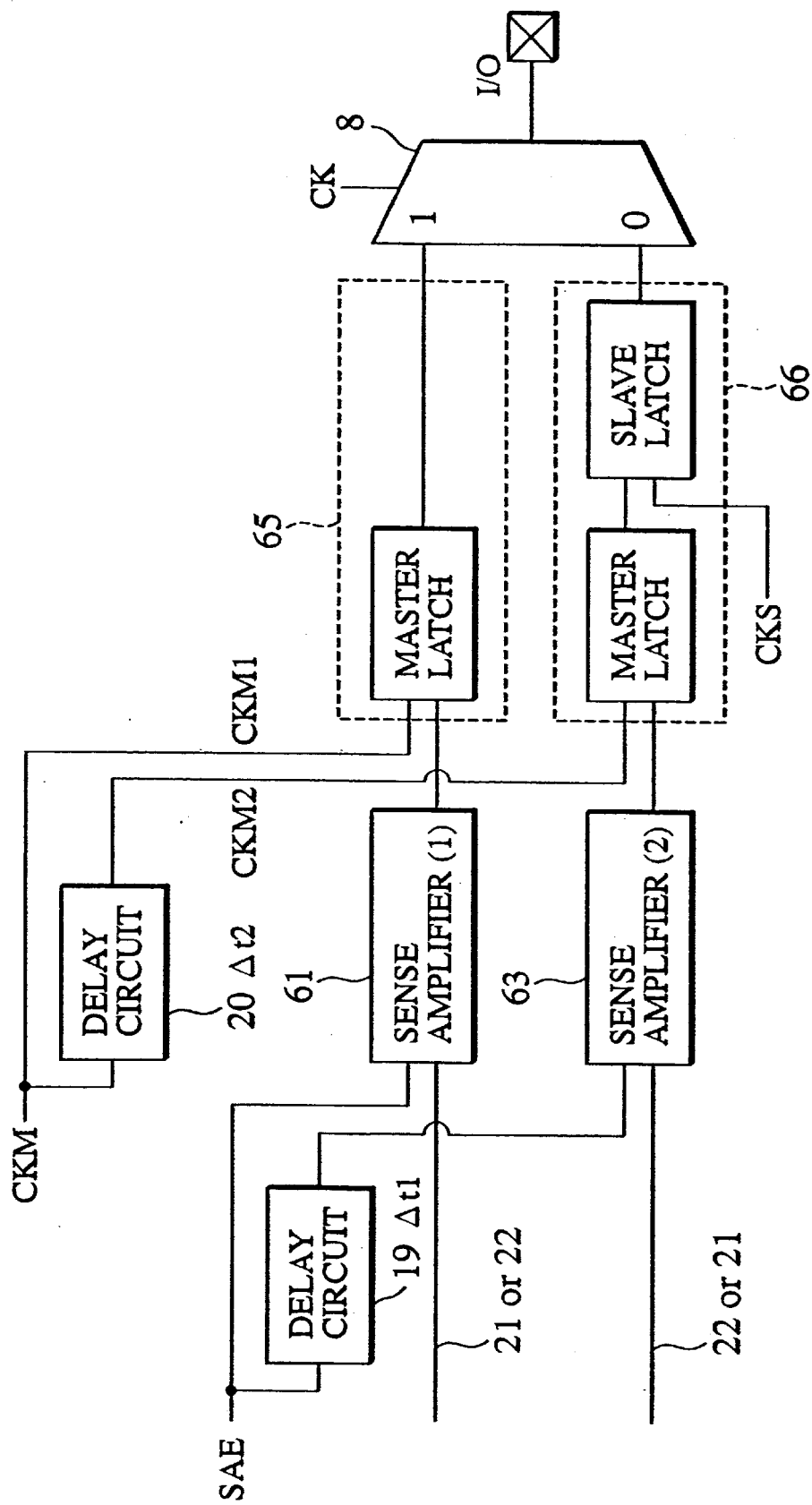
FIG. 11 is a block diagram showing the output control unit of the semiconductor memory device supporting the double data rate mode in accordance with the second embodiment of the present invention.

FIG. 11 is a block diagram showing the output control unit of the semiconductor memory device supporting the double data rate mode in accordance with the second embodiment of the present invention. Also in FIG. 11, like reference numbers indicate identical or functionally similar elements in the drawing as the output control unit as illustrated in FIG. 5 and, therefore redundant explanation is not repeated.

The output register 65 connected to the sense amplifier 61 is composed only of a master latch 1. This is because data need not be maintained when the clock signal is pulled down. However, there is no problem even if a slave latch is provided for some reason in manufacturing processes.

On the other hand, the output register 66 connected to the sense amplifier 63 is composed of a master latch and a slave latch. In this case, the clock signal (CKM2) for driving the master latch of the output register 66 is given a delay Δt2 by means of the delay circuit 20 as compared with the clock signal (CKM1) for driving the master latch of the output register 65.

By this control configuration, the output signal from the output register 66 is delayed as compared with the output signal from the output register 65. However, this never impose a bottleneck limiting the operation speed of the memory because there is no problem as long as the data item as output from the output register 66 becomes ready when the later half of the subsequent cycle of the clock signal, i.e., when the clock signal is pulled down. It is required that the delay time Δt1 satisfy 0≤Δt1≤Tcy/2 to delay the data item as output from the output register 66 until the later half of the subsequent cycle.

Figure 12:
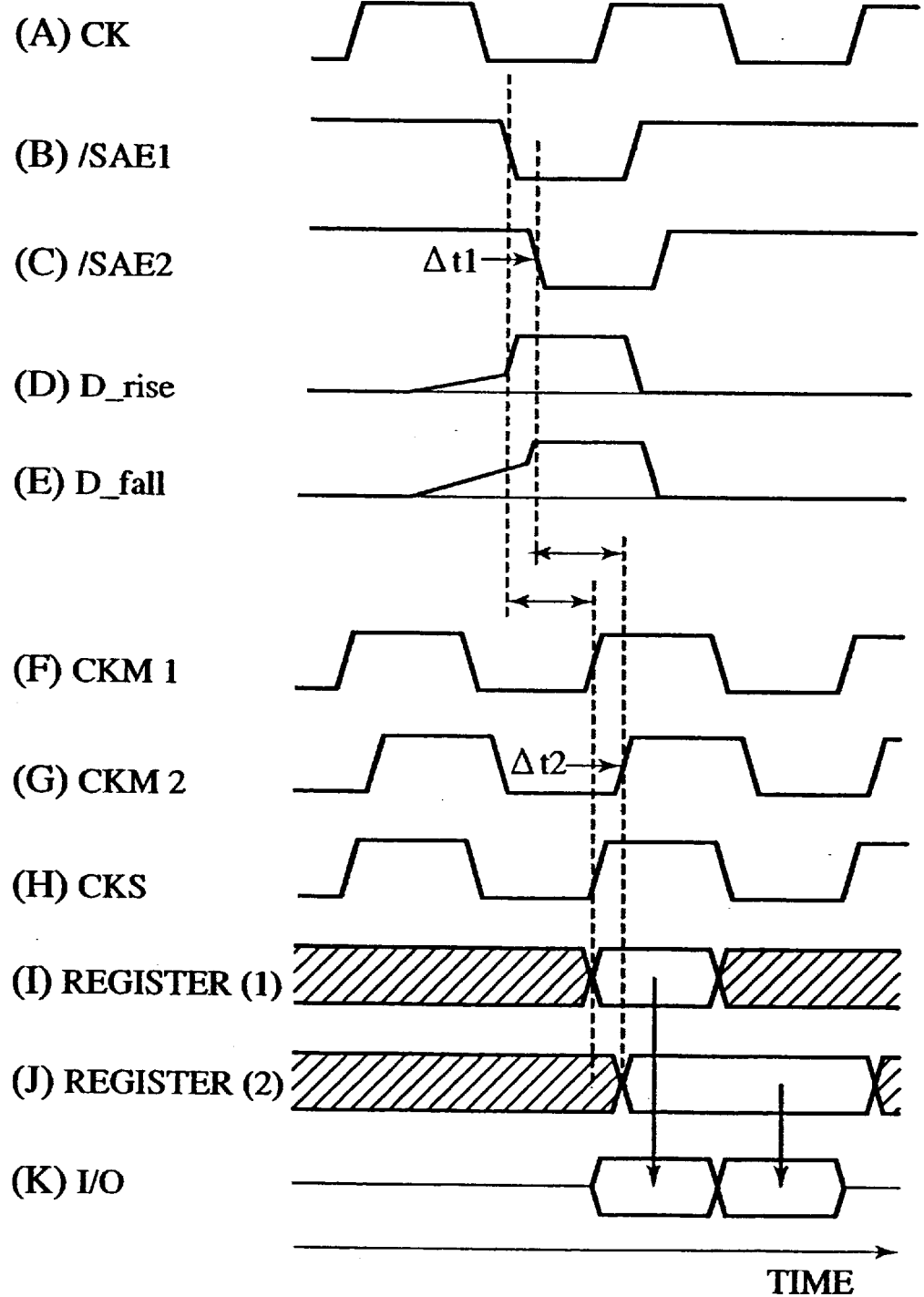
FIG. 12 is a schematic diagram showing waveforms of the respective signals appearing when data is read from the semiconductor memory device provided with the output control unit as illustrated in FIG. 11.

FIG. 12 is a schematic diagram showing waveforms of the respective signals appearing when data is read from the semiconductor memory device provided with the output control unit as illustrated in FIG. 11. FIG. 12(A) shows the waveform of the clock signal (CK) for use in the output control unit; FIG. 12(B) shows the waveform of the sense amplifier enabling signal /SAE1; FIG. 12(C) shows the waveform of the sense amplifier enabling signal /SAE2; FIG. 12(D) shows the waveform of the output signal of the sense amplifier 61; FIG. 12(E) shows the waveform of the output signal of the sense amplifier 63; FIG. 12(F) shows the waveform of the clock signal for driving the master latch of the output register 65; FIG. 12(G) shows the waveform of the current the clock signal for driving the master latch of the output register 66; FIG. 12(H) shows the waveform of the current the clock signal for driving the slave latch of the output register 66; FIG. 12(I) shows the output data of the output register 65; FIG. 12(J) shows the output data of the output register 66; and FIG. 12(K) shows the output data of the multiplexer 8.

By providing the delay circuit 20, and thereby providing a delay between the clock signal CKM1 and CKM2 for driving the master latches, to secure a sufficient margin for latching data after output data becomes ready at the output terminals of the sense amplifier 61 and the sense amplifier 63, which are connected to the input terminals of the output register 65 and the output register 66, i.e., to provide a sufficient time period between the sense amplifier enabling signal /SAE1 and the clock signal CKM1 and also a sufficient time period between the sense amplifier enabling signal /SAE2 and the clock signal CKM2. The data transmission from the sense amplifier 63 to the output register 65 can be performed with a sufficient marginal time even with delay times of Δt1 and Δt2, as compared with the data transmission from the sense amplifier 61 to the output register 66, by adjusting the delay times of the delay circuit 19 and the delay circuit 20 to satisfy $$0 \leq \Delta t1 \leq \Delta t2 \leq Tcy/2$$

Figure 13:
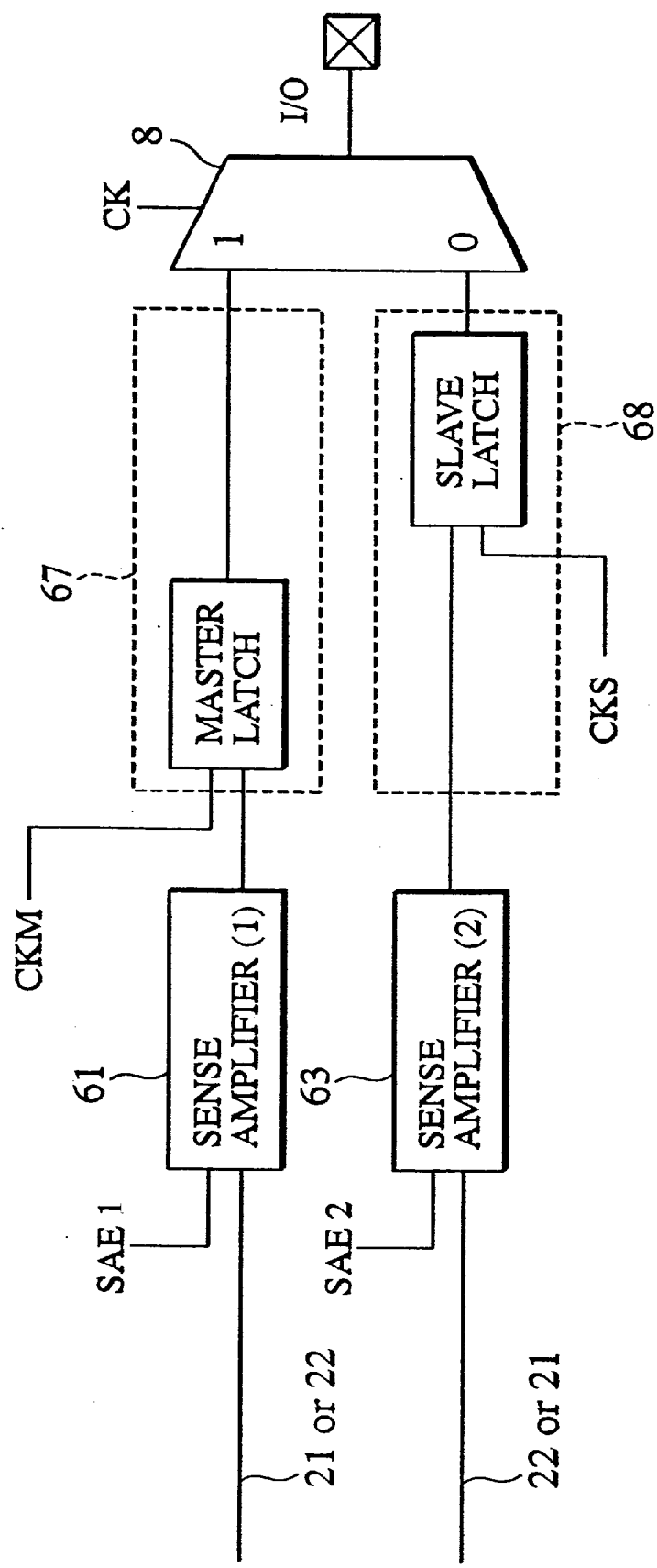
FIG. 13 is a block diagram showing the output control unit of the semiconductor memory device supporting the double data rate mode in accordance with a third embodiment of the present invention.

FIG. 13 is a block diagram showing the output control unit of the semiconductor memory device supporting the double data rate mode in accordance with a third embodiment of the present invention. Also in FIG. 11, like reference numbers indicate identical or functionally similar elements in the drawing as the output control unit as illustrated in FIG. 5 and, therefore redundant explanation is not repeated.

In accordance with this embodiment of the present invention, the differential activation time between the sense amplifier enabling signals /SAE1 and /SAE2 is extended to about a half of the cycle time, i.e., Tcy/2. In this case, the output register 68 is no longer responsible for maintaining data while the clock signal is pulled up so that the master latch of the output register 68 can be dispensed with in the same manner as the slave latch of the output register 67 is dispensed with, since the output register 67 is not responsible for maintaining data while the clock signal is pulled down. It is therefore possible to make the semiconductor memory device faster and to reduce the power dissipation.

Figure 14:
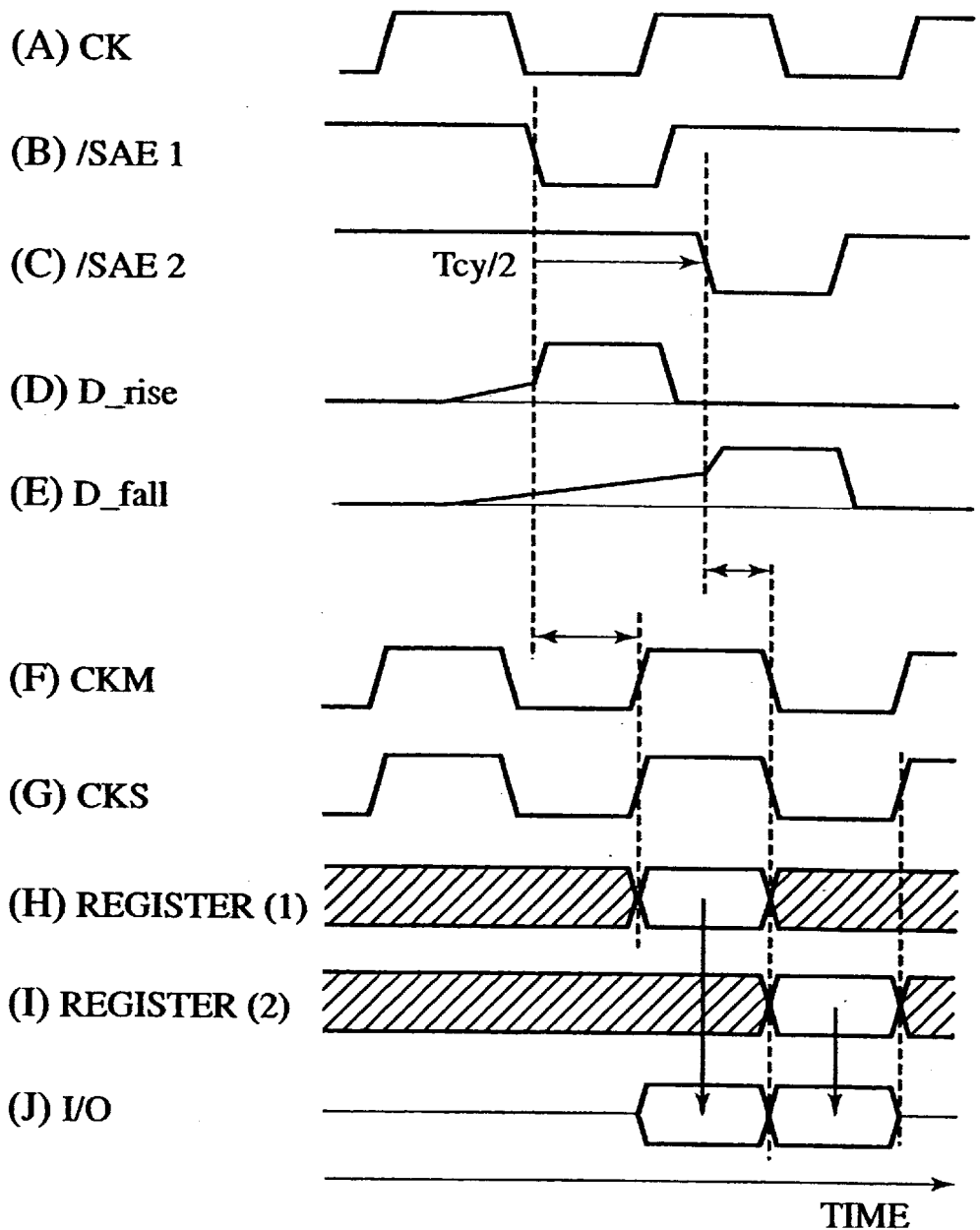
FIG. 14 is a schematic diagram showing waveforms of the respective signals appearing when data is read from the semiconductor memory device provided with the output control unit as illustrated in FIG. 13.

FIG. 14 is a schematic diagram showing waveforms of the respective signals appearing when data is read from the semiconductor memory device provided with the output control unit as illustrated in FIG. 13. FIG. 14(A) shows the waveform of the clock signal (CK) for use in the output control unit; FIG. 14(B) shows the waveform of the sense amplifier enabling signal /SAE1; FIG. 14(C) shows the waveform of the sense amplifier enabling signal /SAE2; FIG. 14(D) shows the waveform of the output signal of the sense amplifier 61; FIG. 14(E) shows the waveform of the output signal of the sense amplifier 63; FIG. 14(F) shows the waveform of the clock signal for driving the master latch of the output register 65; FIG. 14(G) shows the waveform of the current the clock signal for driving the slave latch of the output register 66; FIG. 14(H) shows the output data of the output register 65; FIG. 14(I) shows the output data of the output register 66; and FIG. 14(J) shows the output data of the multiplexer 8.

In this case, the period between the amplification by the sense amplifier 63 and the reception by the output register 68, i.e., the period between the sense amplifier enabling signal /SAE2 and the clock signal CKS corresponds to the period between amplification by the sense amplifier 61 and the reception by the output register 67, i.e., the period between the sense amplifier enabling signal /SAE1 and the clock signal CKM.

Figure 15:
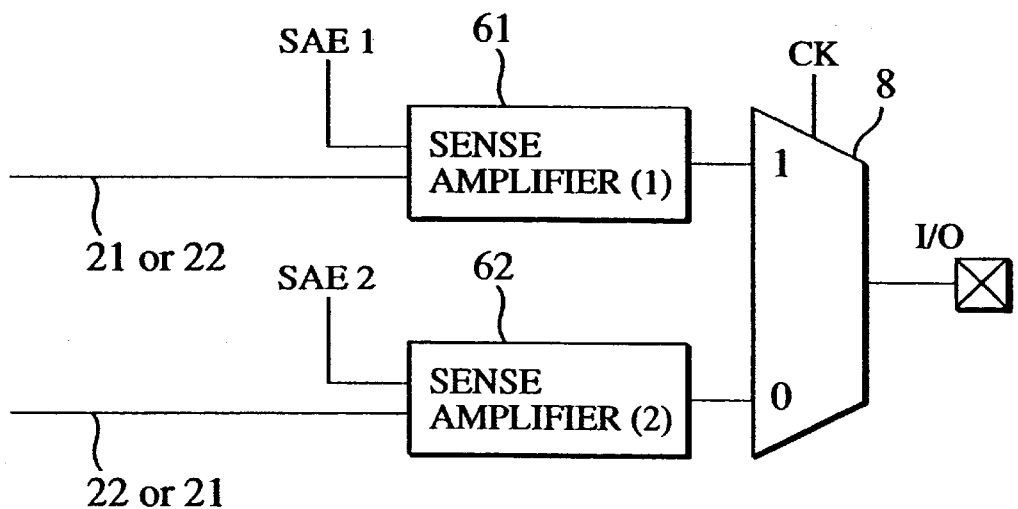
FIG. 15 is a block diagram showing the output control unit of the semiconductor memory device supporting the double data rate mode in accordance with a fourth embodiment of the present invention.

FIG. 15 is a block diagram showing the output control unit of the semiconductor memory device supporting the double data rate mode in accordance with a fourth embodiment of the present invention. Also in FIG. 15, like reference numbers indicate identical or functionally similar elements in the drawing as the output control unit as illustrated in FIG. 5 and, therefore redundant explanation is not repeated. In the case where the sense amplifier 61 and the sense amplifier 62 are designed to maintain data for a time period no shorter than a half of the machine cycle, the register circuit can be dispensed with as illustrated in FIG. 15.

Figure 16:
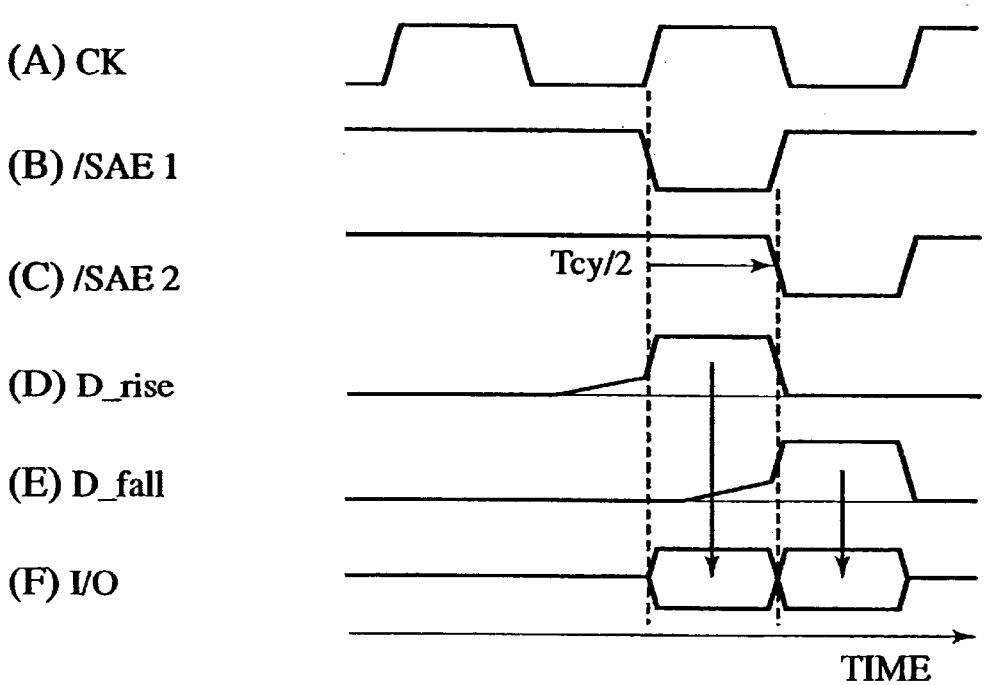
FIG. 16 is a schematic diagram showing waveforms of the respective signals appearing when data is read from the semiconductor memory device provided with the output control unit as illustrated in FIG. 15.

FIG. 16 is a schematic diagram showing waveforms of the respective signals appearing when data is read from the semiconductor memory device provided with the output control unit as illustrated in FIG. 15. FIG. 16(A) shows the waveform of the clock: signal (CK) for use in the output circuit; FIG. 16(B) shows the waveform of the sense amplifier enabling signal /SAE1; FIG. 16(C) shows the waveform of the sense amplifier enabling signal /SAE2; FIG. 16(D) shows the waveform of the output signal of the sense amplifier 61; FIG. 16(E) shows the waveform of the output signal of the sense amplifier 63; and FIG. 16(F) shows the output data of the multiplexer 8.

The sense amplifier enabling signals /SAE1 and /SAE2 are displaced from each other a distance of about Tcy/2 so that the sense amplifiers 61 and 63 are can maintain data for a half of the cycle time Tcy, from the sense amplifier enabling signal, respectively, to make the semiconductor memory device faster and to reduce the power dissipation.

As explained above in detail, in accordance with the present invention, it is possible to disperse the electric current peak time points and reduce the noise level without compromising the reading speed by deferring activation of the sense amplifier, which is one of the two sense amplifiers for sensing and amplifying data to be outputted when the clock signal is pulled down, while the other sense amplifier serves to sense and amplify data to be outputted when the clock signal is pulled up. Also, in the sense amplifier which senses and amplify data to be outputted when the clock signal is pulled up, the interval between when the address becomes ready and the time point when the sense amplifier enabling signal is given is elongated, as compared with the case with the sense amplifier 61, resulting in a relatively large margin for sensing and therefore resulting in a noise proof structure.

Furthermore, it is possible to reduce the power consumption and the area of the semiconductor chip by designing the size of the transistors of the sense amplifier for sensing and amplifying data to be outputted when the clock signal is pulled down to be smaller than that of the transistors of the sense amplifier for sensing and amplifying data to be outputted when the clock signal is pulled up.

The design of one of the output registers can be simplified by deferring activation of the sense amplifier provided for sensing and amplifying data to be outputted when the clock signal is pulled down with a delay time $\Delta t1$ of about the cycle time Tcy, satisfying the equation of $0 \leq \Delta t1 \leq Tcy/2$, so that it is possible to make the semiconductor memory device faster and to reduces the power dissipation.

Also, it is possible to make the semiconductor memory device faster and to reduces the power dissipation by deferring activation of the sense amplifier provided for sensing and amplifying data to be outputted when the clock signal is pulled down with a delay time of about a half of the cycle time.

Furthermore, the sense amplifier 61 and the sense amplifier 62 are designed to maintain data for a time period of no shorter than a half of the machine cycle while deferring activation of the sense amplifier provided for sensing and amplifying data to be outputted when the clock signal is pulled down by a half of the machine cycle, so that it is possible to reduce the area of the semiconductor chip and to make the semiconductor memory device faster and to reduce the power dissipation.

The foregoing description of the preferred embodiments has been presented for purposes of illustration and description. It is not intended to be exhaustive or to limit the invention to the precise form described, and obviously many modifications and variations are possible in light of the above teaching. The embodiments were chosen in order to explain most clearly the principles of the invention and its practical application thereby to enable others in the art to utilize most effectively the invention in various embodiments and with various modifications as are suited to the particular use contemplated.

What is claimed is:

1. A synchronous semiconductor memory device comprising:

a memory cell array comprising a plurality of memory cells for storing data items;

a row selection circuit for receiving a row address signal and selecting a row of said memory cell array;

a column selection circuit for receiving a column address signal decoded and simultaneously selecting first and second columns of said memory cell array;

first and second sense amplifiers amplifying first and second data items, respectively, which are selected by said row selection circuit and said column selection circuit, and outputted to first and second data lines;

a first delay circuit imposing a delay time $\Delta t1$ on a first activation signal for activating said first sense amplifier, said delay time $\Delta t1$ being selected to satisfy $0 \leq \Delta t1 \leq Tcy/2$ where Tcy is a cycle time of said semiconductor memory device;

first and second data storage elements for latching said first and second data items as amplified by said first and second sense amplifiers, respectively; and a selector element for sequentially outputting said first and second data items, which are latched by said first and second data storage elements in a time-interleaved manner;

wherein said second sense amplifier is activated after said first sense amplifier is activated.

2. A semiconductor memory device as claimed in claim 1, wherein a first data item amplified by said first sense amplifier is selected and outputted when the clock signal is pulled up while a second data item amplified by said second sense amplifier is selected and outputted when said clock signal is pulled down.

3. A semiconductor memory device as claimed in claim 1, wherein a size of transistors of said second sense amplifier is smaller than a size of transistors of said first sense amplifier.

4. A semiconductor memory device as claimed in claim 1, wherein said delay time of said first delay circuit is about a half of the cycle time of said semiconductor memory device.

5. A semiconductor memory device as claimed in claim 1, wherein said selector element serves to selectively output said first and second data items in synchronism with a rising edge and a falling edge of a system clock.

6. A semiconductor memory device as claimed in claim 1 wherein said first data storage element comprises a latch circuit which latches for a preceding half period of a cycle time that a data item, which is obtained after a first control clock signal, is pulled up, and said second data storage element comprises a latch circuit which latches through said cycle time a data item which is obtained in synchronism with a second control clock signal is pulled up.

7. A synchronous semiconductor memory device comprising:

a memory cell array comprising a plurality of memory cells for storing data items;

a row selection circuit for receiving a row address signal and selecting a row of said memory cell array;

a column selection circuit for receiving a column address signal decoded and simultaneously selecting first and second columns of said memory cell array;

first and second sense amplifiers amplifying first and second data items, respectively, which are selected by said row selection circuit and said column selection circuit, and outputted to first and second data lines;

a first data storage element that latches said first data item amplified by said first sense amplifier and a second data storage element that latches said second data item amplified by said second sense amplifier;

a first delay circuit for generating a second activation signal by imposing a delay time $\Delta t1$ on a first activation signal for activating said first sense amplifier, said delay time $\Delta t1$ being selected to satisfy $0 \leq \Delta t1 \leq Tcy/2$ where Tcy is a cycle time of said semiconductor memory device;

a second delay circuit for deferring the operation of said second data storage element to latch said second data item after said first data storage element latches said first data item; and a selector element for sequentially outputting said first and second data items, which are amplified by said first and second sense amplifiers, in a time-interleaved manner;

wherein said second sense amplifier is activated by said second activation signal after said first sense amplifier is activated.

8. A semiconductor memory device as claimed in claim 7, wherein said first data storage element comprises a latch circuit which latches for a preceding half period of a cycle time that a data item, which is obtained in synchronism with a control clock signal, is pulled up, and said second data storage element comprises a latch circuit which latches for a subsequent half period of said cycle time a data item, which is obtained after said control clock signal, is pulled down.

9. A semiconductor memory device as claimed in claim 8, wherein a delay time of said first delay circuit is about a half of said cycle time.

10. A synchronous semiconductor memory device comprising:

a memory cell array comprising a plurality of memory cells for storing data items;

first and second sense amplifiers connected in parallel to one output terminal for amplifying said data items stored in said plurality of memory cells;

first and second data storage elements for latching said first and second data items as amplified by said first and second sense amplifiers, respectively;

a selector element selectively outputting said data items as output as latched by said first and second data storage elements; and a first delay circuit for displacing a time point at which said second sense amplifier is activated from a time point at which said first sense amplifier is activated, said displacing accomplished by receiving an activation signal at said first delay circuit, imposing a time delay on said activation signal, and sending a delayed activation signal to said second sense amplifier, said delay time $\Delta t1$ imposed by said first delay circuit being selected to satisfy $0 \leq \Delta t1 \leq Tcy/2$ where Tcy is a cycle time of said semiconductor memory device;

said first and second sense amplifiers being controlled to maintain output data for a time period no shorter than a half of a cycle time of said semiconductor memory device.

11. A semiconductor memory device as claimed in claim 10, wherein a first data item amplified by said first sense amplifier is selected and outputted when the clock signal is pulled up while a second data item amplified by said second sense amplifier when said clock signal is pulled down.

12. A semiconductor memory device as claimed in claim 10, wherein said second sense amplifier is activated about a half of said cycle time after said first sense amplifier is activated.

13. A synchronous semiconductor memory device comprising:

a memory cell array comprising a plurality of memory cells for storing data items;

a row selection circuit receiving a row address signal and selecting a row of said memory cell array;

a column selection circuit for receiving a column address signal and simultaneously selecting a plurality of columns of said memory cell array;

a plurality of sense amplifiers for amplifying a plurality of data items which are selected by said row selection circuit and said column selection circuit and outputted to a plurality of data lines;

a plurality of data storage elements for latching said plurality of data items as amplified by said sense amplifiers, respectively;

a delay circuit connected to one of said plurality of sense amplifiers, said delay circuit receiving a first activation signal and sending a second activation signal delayed from said first activation signal by imposing a delay time on said first activation signal, said first activation signal activating said one of the plurality of sense amplifiers and said second activation signal activating another one of said plurality of sense amplifiers, said delay time $\Delta t1$ imposed by said delay circuit being selected to satisfy $0 \leq \Delta t1 \leq Tcy/2$ where Tcy is a cycle time of said semiconductor memory device; and a selector element for sequentially outputting said data items which are latched by said data storage elements in a time-interleaved manner, wherein said plurality of sense amplifiers are activated sequentially.

14. A semiconductor memory device as claimed in claim 13, wherein said plurality of sense amplifiers comprises a first sense amplifier and a second sense amplifier, wherein a first data item amplified by said first sense amplifier is selected and outputted when a clock signal is pulled up while a second data item amplified by said second sense amplifier when said clock signal is pulled down.

15. A method of operating a synchronous semiconductor memory device comprising the steps of:

storing data items in a memory cell array comprising a plurality of memory cells;

receiving a row address signal and selecting a row of said memory cell array;

receiving a column address signal and simultaneously selecting first and second columns of said memory cell array;

providing an activation signal substantially simultaneously to a first sense amplifier and to a first delay circuit;

delaying said activation signal at said first delay circuit by imposing a delay time Δt1 on said activation signal, said delay time Δt1 being selected to satisfy 0≦Δt1≦Tcy/2 where Tcy is a cycle time of said semiconductor memory device; and providing said delayed activation signal to a second sense amplifier, said delayed activation signal activating said second sense amplifier;

amplifying first and second data items, respectively, and outputting said first and second data items to first and second data lines;

latching said first data item with a first data storage element;

latching said second data item with a second data storage element; and sequentially outputting said latched first and second data items in a time-interleaved manner, said second data item being amplified after said first data item is amplified.

16. A method of operating a semiconductor memory device as claimed in claim 15, further comprises the step of deferring operation of said second data storage element to latch said second data item after said first data storage element latches said first data item.

17. A method of operating a semiconductor memory device as claimed in claim 15 wherein said delay time is about a half of a cycle time of said semiconductor memory device.

18. A method of operating a semiconductor memory device as claimed in claim 15, wherein said first and second data items are selectively output in synchronism with a rising edge and a falling edge of a system clock.

19. A method of operating a semiconductor memory device as recited in claim 15 wherein the correspondence of said first and second data items to said first and second data lines is changed in accordance with said column address signal.

20. A method f operating a semiconductor memory device as recited in claim 19 wherein the correspondence of said first and second data items to said first and second data lines is changed in accordance with said column address signal in accordance with whether said column address signal indicates an odd or even address.

21. A method of operating a synchronous semiconductor memory device comprising the steps of:

storing data items in a plurality of memory cells in a memory cell array;

amplifying said data items through first and second sense amplifiers connected in parallel to one output terminal;

latching said first and second data items by first and second data storage elements;

selectively outputting said data items as latched by said first and second sense amplifiers;

displacing a time point at which said first sense amplifier is amplified from a time point at which said second sense amplifier is activated, said step of displacing comprising the steps of:

intercepting an activation signal sent to said second sense amplifier, said activation signal being sent substantially simultaneously to both of said first and said second sense amplifiers;

delaying said intercepted activation signal by imposing a delay time Δt1 on said activation signal, said delay time Δt1 being selected to satisfy 0≦Δt1≦Tcy/2 where Tcy is a cycle time of said semiconductor memory device; and sending said delayed activation signal to said second sense amplifier; and controlling said first and second sense amplifiers to maintain output data for a time period no shorter than half of a cycle time said semiconductor memory device.

22. A method of operating a semiconductor memory device as claimed in claim 21, further comprising the step of activating said second sense amplifier approximately a half of said cycle time after said first sense amplifiers is activated.

23. A method f operating a semiconductor memory device as recited in claim 21 wherein the order of the time point at which said first sense amplifier is amplified and the time point at which said second sense amplifier is activated is changed in accordance with a column address signal.

24. A method f operating a semiconductor memory device as recited in claim 23 wherein the order of the time point at which said first sense amplifier is amplified and the time point at which said second sense amplifier is activated is changed in accordance with said column address signal in accordance with whether said column address signal indicates an odd or even address.

25. A method of operating a synchronous semiconductor memory device comprising the steps of:

storing data items in a memory cell array comprising a plurality of memory cells;

selecting a row of said memory cell array;

simultaneously selecting a plurality of columns of said memory cell array;

amplifying a plurality of said data items selected in said selecting steps with a plurality of sense amplifiers, one of said sense amplifiers being amplified by a delayed activation signal sent from a delay circuit, said delay circuit receiving an activation signal and imposing a delay time Δt1 on said activation signal, said delay time Δt1 being selected to satisfy 0≦Δt1≦Tcy/2 where Tcy is a cycle time of said semiconductor memory device;

latching said plurality of data items as amplified by a plurality of data storage elements, respectively; and sequentially outputting said latched data items in a time-interleaved manner;

wherein said plurality of sense amplifiers are activated sequentially.

26. A method of operating a semiconductor memory device as recited in claim 25 wherein said amplified data items are sequentially outputted in a timing order which is changed in accordance with a column address signal.

27. A method of operating a semiconductor memory device as recited in claim 26 wherein the timing order is changed in accordance with said column address signal in accordance with whether said column address signal indicates an odd or even address.

28. A synchronous semiconductor memory device comprising:

a memory cell array comprising a plurality of memory cells for storing data items;

a row selection circuit for receiving a row address signal and selecting a row of said memory cell array;

a column selection circuit for receiving a column address signal decoded and simultaneously selecting first and second columns of said memory cell array;

first and second sense amplifiers amplifying first and second data items, respectively, which are selected by said row selection circuit and said column selection circuit, and outputted to first and second data lines;

a first switch circuit and a second switch circuit, said first switch circuit being configured to selectively connect said first sense amplifier with either data line of said first and second data lines, while said second switch circuit being configured to selectively connect said second sense amplifier with the other data line of said first and second data lines, in accordance with said column address signal; and a selector element for sequentially outputting said first and second data items, which are amplified by said first and second sense amplifiers, in a time-interleaved manner;

wherein said second sense amplifier is activated after said first sense amplifier is activated by imposing a delay time Δt1 on an activation signal for said second sense amplifier, said delay time Δt1 being selected to satisfy 0≦Δt1≦Tcy/2 where Tcy is a cycle time of said semiconductor memory device.

29. A semiconductor memory device as claimed in claim 28 wherein said first switch circuit and said second switch circuit serve to switch the connections of said first and second sense amplifiers with said first and second data lines in accordance with whether said column address signal indicates an odd or even address.

30. A synchronous semiconductor memory device comprising:

a memory cell array comprising a plurality of memory cells for storing data items;

first and second sense amplifiers connected in parallel to one output terminal for amplifying said data items stored in said plurality of memory cells, said first and second sense amplifiers being controlled to maintain output data for a time period no shorter than a half of a cycle time of said semiconductor memory device;

a selector element selectively outputting said data items as output from said first and second sense amplifiers;

a first delay circuit for displacing a time point at which said second sense amplifier is activated from a time point at which said first sense amplifier is activated by imposing a delay time Δt1 on an activation signal to aid second sense amplifier, said delay time Δt1 being selected to satisfy 0≦Δt1≦Tcy/2 where Tcy is a cycle time of said semiconductor memory device; and a first switch circuit and a second switch circuit, said first switch circuit being configured to selectively connect said first sense amplifier with one of a first data item and a second item data item of said data items in accordance with a column address signal, while said second switch circuit being configured to selectively connect said second sense amplifier with the other of said first data item and second data item, in accordance with said column address signal as given to said memory cell array.

31. A semiconductor memory device as claimed in claim 30 wherein said first switch circuit and said second switch circuit serve to switch the connections of said first and second sense amplifiers with said first and second data items in accordance with whether said column address signal indicates an odd or even address.

32. A synchronous semiconductor memory device comprising:

a memory cell array comprising a plurality of memory cells for storing data items;

a row selection circuit receiving a row address signal and selecting a row of said memory cell array;

a column selection circuit for receiving a column address signal and simultaneously selecting a plurality of columns of said memory cell array;

a plurality of sense amplifier for amplifying a plurality of data items which are selected by said row selection circuit and said column selection circuit and outputted to a plurality of data lines;

a selector element for sequentially outputting said data items which are amplified by said plurality of sense amplifiers in a time-interleaved manner; and a switch circuit which is configured to change correspondence of said sense amplifiers to said data lines in accordance with said column address signal;

wherein said plurality of sense amplifiers are activated sequentially by imposing a delay time Δt1 on an activation signal to at least one of said sense amplifiers, said delay time Δt1 being selected to satisfy 0≦Δt1≦Tcy/2 where Tcy is a cycle time of said semiconductor memory device.

33. A semiconductor memory device as claimed in claim 32 wherein said switch circuit changes the correspondence of said sense amplifiers to said data lines in accordance with whether said column address signal indicates an odd or even address.

34. A synchronous semiconductor memory device comprising:

a memory cell array comprising a plurality of memory cells for storing data items;

a selection circuit for receiving an address signal decoded by a decoder and selecting first and second data items stored in said memory cell array;

first and second sense amplifiers amplifying said first and second data items, respectively, which are selected by said selection circuit and outputted to first and second data lines;

first and second data storage elements for latching said first and second data items as amplified by said first and second sense amplifiers, respectively; and a selector element for sequentially outputting said first and second data items which are latched by said first and second data storage elements in a time interleaved manner;

wherein said second sense amplifier is activated after said first sense amplifier is activated, said second sense amplifier is activated by a second activation signal which is generated through a first delay circuit by imposing a delay time on a first activation signal for activating said first sense amplifier, and the delay time Δt1 imposed by said first delay circuit is selected to satisfy 0≦Δt1≦Tcy/2 where Tcy is a cycle time of said semiconductor memory device.

35. A semiconductor memory device as claimed in claim 34 wherein a first data item amplified by said first sense amplifier is selected and outputted when the clock signal is pulled up while a second data item amplified by said second sense amplifier is selected and outputted when said clock signal is pulled down.

36. A semiconductor memory device as claimed in claim 34 wherein a size of transistors of said second sense amplifier is smaller than a size of transistors of said first sense amplifier.

37. A semiconductor memory device as claimed in claim 36 wherein said first data storage element comprises a latch circuit which latches for a preceding half period of a cycle time that a data item, which is obtained after a first control clock signal, is pulled up, and said second data storage element comprises a latch circuit which latches through said cycle time a data item which is obtained in synchronism with a second control clock signal is pulled up.

38. A semiconductor memory device as claimed in claim 34 wherein said first data storage element comprises a latch circuit which latches for a preceding half period of a cycle time that a data item, which is obtained in synchronism with a control clock signal, is pulled up, and said second data storage element comprises a latch circuit which latches for a subsequent half period of said cycle time a data item, which is obtained after said control clock signal is pulled down.

39. A semiconductor memory device as claimed in claim 38 wherein a delay time of said first delay circuit is about a half of said cycle time.

40. A semiconductor memory device as claimed in claim 34 wherein the delay time of said first delay circuit is about a half of the cycle time of said semiconductor memory device.

41. A semiconductor memory device as claimed in claim 34 wherein said selector element serves to selective y output said first and second data items in synchronism with a rising edge and a falling edge of system clock.

42. A synchronous semiconductor memory device comprising:

a memory cell array comprising a plurality of memory cells for storing data items;

a selection circuit for receiving an address signal decoded by a decoder and selecting first and second data items stored in said memory cell array;

first and second sense amplifiers amplifying said first and second data items, respectively, which are selected by said selection circuit and outputted to first and second data lines;

a first delay circuit directly connected to said second sense amplifier, said first delay circuit receiving a first activation signal and generating a second activation signal delayed from said first activation signal by imposing a delay time $\Delta t1$ on said first activation signal, said delay time $\Delta t1$ being selected to satisfy $0 \leq \Delta t1 \leq Tcy/2$ where Tcy is a cycle time of said semiconductor memory device, said first sense amplifier being activated by said first activation signal and said second sense amplifier being activated by said second activation signal;

a second delay circuit for deferring the operation of said second data storage element to latch said second data item after said first data storage element latches said first data item; and a selector element for sequentially outputting said first and second data items which are amplified by said first and second sense amplifiers in a time interleaved manner;

wherein said second sense amplifier is activated after said first sense amplifier is activated.

43. A synchronous semiconductor memory device comprising:

a memory cell array comprising a plurality of memory cells for storing data items;

a selection circuit for receiving an address signal decoded by a decoder and selecting first and second data items stored in said memory cell array;

first and second sense amplifiers amplifying said first and second data items, respectively, which are selected by said selection circuit and outputted to first and second data lines;

a first switch circuit and a second switch circuit, said first switch circuit being configured to selectively connect said first sense amplifier with either data line(s) of said first and second data lines, while said second switch circuit being configured to selectively connect said second sense amplifier with the other data line(s) of said first and second data lines, in accordance with said address signal; and a selector element for sequentially outputting said first and second data items which are amplified by said first and second sense amplifiers in a time interleaved manner;

wherein said second sense amplifier is activated after said first sense amplifier is activated by imposing a delay time $\Delta t1$ on an activation signal to said second sense amplifier, said delay time $\Delta t1$ being selected to satisfy $0 \leq \Delta t1 \leq Tcy/2$ where Tcy is a cycle time of said semiconductor memory device.

44. A semiconductor memory device as claimed in claim 43 wherein said first switch circuit and said second switch circuit serve to switch the connections of said first and second sense amplifiers with said first and second data lines in accordance with whether said address signal indicates an odd or even address.

45. A synchronous semiconductor memory device comprising:

a memory cell array comprising a plurality of memory cells for storing data items;

a selection circuit receiving an address signal decoded by a decoder and selecting a plurality of data items stored in said memory cell array;

a plurality of sense amplifier for amplifying data items which are selected by said selection circuit and outputted to a plurality of data lines;

a delay circuit connected to one of said plurality of sense amplifiers, said delay circuit receiving a first activation signal an sending a second activation signal delayed from said first activation signal by imposing a delay time $\Delta t1$ on said first activation signal, said delay time $\Delta t1$ being selected to satisfy $0 \leq \Delta t1 \leq Tcy/2$ where Tcy is a cycle time of said semiconductor memory device, said second activation signal activating said one of the plurality of sense amplifiers and said first activation signal activating another one of said plurality of sense amplifiers;

a plurality of data storage elements for latching said plurality of data items as amplified by said sense amplifiers respectively; and a selector element for sequentially outputting said data items which are latched by said data storage elements in a time-interleaved manner, wherein said plurality of sense amplifiers are activated sequentially.

46. A semiconductor memory device as claimed in claim 45 wherein said plurality of sense amplifiers comprises a first sense amplifier and a second sense amplifier, wherein a first data item amplified by said first sense amplifier is selected and outputted when the clock signal is pulled up while a second data item amplified by said second sense amplifier when said clock signal is pulled down.

47. A synchronous semiconductor memory device comprising:

a memory cell array comprising a plurality of memory cells for storing data items;

a selection circuit receiving address signal decoded by a decoder and selecting a plurality of data items stored in said memory cell array;

a plurality of sense amplifier for amplifying data items which are selected by said selection circuit and outputted to a plurality of data lines;

a selector element for sequentially outputting said data items which are amplified by said plurality of sense amplifiers in a time-interleaved manner; and a switch circuit which is configured to change correspondence of said sense amplifiers to said data lines in accordance with said address signal;

wherein said plurality of sense amplifiers are activated sequentially by imposing a delay time $\Delta t1$ on an activation signal to at least one of said sense amplifiers, said delay time $\Delta t1$ being selected to satisfy $0 \leq \Delta t1 \leq Tcy/2$ where Tcy is a cycle time of said semiconductor memory device.

48. A semiconductor memory device as claimed in claim 47 wherein said switch circuit changes the correspondence of said sense amplifiers to said data lines in accordance with whether said address signal indicates an odd or even address.

49. A method of operating a synchronous semiconductor memory device comprising the steps of:

storing data items in a memory cell array comprising a plurality of memory cells;

receiving an address signal and selecting first and second data items stored in said memory cell array;

providing an activation signal substantially simultaneously to a first sense amplifier and to a first delay circuit;

delaying said activation signal at said first delay circuit by imposing a delay time $\Delta t1$ on said activation signal, said delay time $\Delta t1$ being selected to satisfy $0 \leq \Delta t1 \leq Tcy/2$ where Tcy is a cycle time of said semiconductor memory device; and providing said delayed activation signal to a second sense amplifier, said delayed activation signal activating said second sense amplifier;

amplifying said first and second data items, respectively, and outputting said first and second data items to first and second data lines;

latching said first and second data items by first and second data storage elements; and sequentially outputting said latched first and second data items in a time-interleaved manner; said second data item being amplified after said first data item is amplified.

50. A method of operating a semiconductor memory device as claimed in claim 49, wherein said first and second data items are selectively output in synchronism with a rising edge and a falling edge of a system clock.

51. A method of operating a semiconductor memory device as recited in claim 49 wherein the correspondence of said first and second data items to said first and second data lines is changed in accordance wit said address signal.

52. A method of operating a semiconductor memory device as recited in claim 51 wherein the correspondence of aid first and second data items to said first and second data lines is changed in accordance wit said column address signal in accordance with whether said address signal indicates an odd or even address.

53. A method of operating a synchronous semiconductor memory device comprising the steps of:

storing data items in a memory cell array comprising a plurality of memory cells;

receiving an address signal and selecting first and second data items stored in said memory cell array;

providing an activation signal substantially simultaneously to a first sense amplifier and to a first delay circuit;

generating a delayed activation signal at said first delay circuit and providing said delayed activation signal directly to a second sense amplifier, which is achieved by imposing a delay time $\Delta t1$ on said activation signal, said delay time $\Delta t1$ being selected to satisfy $0 \leq \Delta t1 \leq Tcy/2$ where Tcy is a cycle time of said semiconductor memory device;

amplifying said first and second data items, respectively, and outputting said first and second data items to first and second data lines, said second data item being amplified by providing said delayed activation signal generated through said first delay circuit;

sequentially outputting said amplified first and second data items in a time-interleaved manner; said second data item being amplified after said first data item is amplified; and deferring operation of said second data storage element to latch said second data item after said first data storage element latches said first data item.

54. A method of operating a semiconductor memory device as claimed in claim 53, wherein said delay time is about a half of a cycle time of said semiconductor memory device.

55. A method of operating a synchronous semiconductor memory device comprising the step of:

storing data items in a memory cell array comprising a plurality of memory cells;

selecting a row of said memory cell array;

simultaneously selecting a plurality of said data items stored in said memory cell array;

providing an activation signal substantially simultaneously to a first sense amplifier and to a first delay circuit;

delaying said activation signal at said first delay circuit by imposing a delay time $\Delta t1$ on said activation signal, said delay time $\Delta t1$ being selected to satisfy $0 \leq \Delta t1 \leq Tcy/2$ where Tcy is a cycle time of said semiconductor memory device;

providing said delayed activation signal to a second sense amplifier, said delayed activation signal activating said second sense amplifier;

amplifying said plurality of said data items, selected in said selecting steps, with a plurality of sense amplifiers, which include said first and second sense amplifiers;

latching said plurality of data items by a plurality of data storage elements; and sequentially outputting said latched data items in a time-interleaved manner, wherein said plurality of sense amplifiers are activated sequentially.

56. A method of operating a semiconductor memory device as claimed in claim 55 wherein said amplified data items are sequentially outputted in a timing order which is changed in accordance with a column address signal.

57. A method of operating a semiconductor memory device as claimed in claim 56 wherein the timing order is changed in accordance with said column address signal in accordance with whether said column address signal indicates an odd or even address.

* * * * *

UNITED STATES PATENT AND TRADEMARK OFFICE
CERTIFICATE OF CORRECTION

PATENT NO. : 6,597,626 B2
DATED : July 22, 2003
INVENTOR(S) : Osamu Hirabayashi

It is certified that error appears in the above-identified patent and that said Letters Patent is hereby corrected as shown below:

<u>Title page,</u>
Item [56], References Cited, U.S. PATENT DOCUMENTS, "2/2000" has been replaced with -- 1/2000 --;

<u>Column 12,</u>
Line 26, "$0 \leqq \Delta t1 \leqq Tcy/2$" has been replaced with -- $0 \leq \Delta t1 \leq Tcy/2$ --;

<u>Column 13,</u>
Lines 18 and 66, "$0 \leqq \Delta t1 \leqq Tcy/2$" has been replaced with -- $0 \leq \Delta t1 \leq Tcy/2$ --;

<u>Column 14,</u>
Line 41, "$0 \leqq \Delta t1 \leqq Tcy/2$" has been replaced with -- $0 \leq \Delta t1 \leq Tcy/2$ --;

<u>Column 15,</u>
Lines 4 and 65, "$0 \leqq \Delta t1 \leqq Tcy/2$" has been replaced with -- $0 \leq \Delta t1 \leq Tcy/2$ --;
Line 38, "f" has been replaced with -- of --;

<u>Column 16,</u>
Lines 11 and 16, "f" has been replaced with -- of --;
Line 37, "$0 \leqq \Delta t1 \leqq Tcy/2$" has been replaced with -- $0 \leq \Delta t1 \leq Tcy/2$ --;

<u>Column 17,</u>
Lines 17 and 41, "$0 \leqq \Delta t1 \leqq Tcy/2$" has been replaced with -- $0 \leq \Delta t1 \leq Tcy/2$ --;

<u>Column 18,</u>
Line 1, "amplifier" has been replaced -- amplifiers --;
Lines 15 and 19, "$0 \leqq \Delta t1 \leqq Tcy/2$" has been replaced with -- $0 \leq \Delta t1 \leq Tcy/2$ --;

<u>Column 19,</u>
Line 20, "selective y" has been replaced with -- selectively --;
Line 39, "$0 \leqq \Delta t1 \leqq Tcy/2$" has been replaced with -- $0 \leq \Delta t1 \leq Tcy/2$ --;

<u>Column 20,</u>
Lines 15 and 39, "$0 \leqq \Delta t1 \leqq Tcy/2$" has been replaced with -- $0 \leq \Delta t1 \leq Tcy/2$ --;

UNITED STATES PATENT AND TRADEMARK OFFICE
CERTIFICATE OF CORRECTION

PATENT NO. : 6,597,626 B2
DATED : July 22, 2003
INVENTOR(S) : Osamu Hirabayashi

It is certified that error appears in the above-identified patent and that said Letters Patent is hereby corrected as shown below:

Column 21,
Line 1, "amplifier" has been replaced with -- amplifiers --;
Lines 14 and 33, "$0 \leqq \Delta t1 \leqq Tcy/2$" has been replaced with -- $0 \leq \Delta t1 \leq Tcy/2$ --;
Lines 54 and 59, "wit" has been replaced with -- with --;

Column 22,
Lines 9 and 42, "$0 \leqq \Delta t1 \leqq Tcy/2$" has been replaced with -- $0 \leq \Delta t1 \leq Tcy/2$ --;

Signed and Sealed this

Twentieth Day of July, 2004

JON W. DUDAS
*Acting Director of the United States Patent and Trademark Office*